(12) United States Patent
DeHon

(10) Patent No.: US 7,310,004 B2
(45) Date of Patent: Dec. 18, 2007

(54) APPARATUS AND METHOD OF INTERCONNECTING NANOSCALE PROGRAMMABLE LOGIC ARRAY CLUSTERS

(75) Inventor: Andre M. DeHon, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 258 days.

(21) Appl. No.: 11/193,308

(22) Filed: Jul. 28, 2005

(65) Prior Publication Data

US 2006/0214683 A1 Sep. 28, 2006

Related U.S. Application Data

(63) Continuation-in-part of application No. 10/856,115, filed on May 28, 2004.

(60) Provisional application No. 60/637,515, filed on Dec. 20, 2004, provisional application No. 60/615,991, filed on Oct. 5, 2004, provisional application No. 60/610,840, filed on Sep. 17, 2004, provisional application No. 60/592,514, filed on Jul. 29, 2004.

(51) Int. Cl.
*H01L 25/00* (2006.01)
*H03K 19/177* (2006.01)

(52) U.S. Cl. ............................ 326/41; 326/39; 326/47

(58) Field of Classification Search ............ 326/38–41, 326/47
See application file for complete search history.

(56) References Cited

U.S. PATENT DOCUMENTS 5,349,558 A   9/1994  Cleveland et al. .......... 365/200
6,128,214 A   10/2000 Kuekes et al. .............. 364/151
6,211,510 B1  4/2001  Merril et al. ............. 250/208.1
6,256,767 B1  7/2001  Kuekes et al. ................. 716/9
6,314,019 B1  11/2001 Kuekes et al. .............. 365/151
6,383,784 B1  5/2002  Smith ........................ 435/91.2
6,777,982 B2  8/2004  Goldstein et al. ........... 326/134

(Continued)

FOREIGN PATENT DOCUMENTS

WO           00/73996        12/2000

(Continued)

OTHER PUBLICATIONS

U.S. Appl. No. 10/853,907, filed May 25, 2004, DeHon et al.

(Continued)

*Primary Examiner*—Anh Q. Tran
(74) *Attorney, Agent, or Firm*—Ladas & Parry, LLP

(57) ABSTRACT

An apparatus and methods for interconnecting a plurality of nanoscale programmable logic array (PLA) clusters are disclosed. The appartus allows PLA clusters to be built at nanoscale dimensions, signal restoration to occur at the nanoscale, and interconnection between PLA clusters to be performed with nanoscale wiring. The nanoscale PLA, restoration, and interconnect arrangements can be constructed without using lithographic patterning to produce the nanoscale feature sizes and wire pitches. The nanoscale interconnection of the plurality of nanoscale PLA clusters can implement any logic function or any finite state machine. The nanoscale interconnect allows Manhattan (X,Y grid) routing between arbitrary nanoscale PLA clusters. The methods teach how to interconnect nanoscale PLAs with nanoscale interconnect and how to build arbitrary logic with nanoscale feature sizes without using lithography to pattern the nanoscale features.

73 Claims, 32 Drawing Sheets

U.S. PATENT DOCUMENTS

| | | | |
|---|---|---|---|
| 7,073,157 B2* | 7/2006 | DeHon et al. | 716/17 |
| 2002/0027819 A1 | 3/2002 | Tomanek et al. | 365/215 |
| 2002/0175390 A1 | 11/2002 | Goldstein et al. | 257/481 |
| 2003/0089899 A1 | 5/2003 | Lieber et al. | 257/9 |
| 2003/0200521 A1 | 10/2003 | DeHon et al. | 716/16 |
| 2003/0206436 A1 | 11/2003 | Eaton, Jr. et al. | 365/177 |
| 2004/0113138 A1 | 6/2004 | DeHon et al. | 257/9 |
| 2004/0113139 A1 | 6/2004 | Dehon et al. | 257/9 |
| 2005/0001918 A1 | 1/2005 | Berezin et al. | 348/308 |

FOREIGN PATENT DOCUMENTS

| | | |
|---|---|---|
| WO | 02/103753 A2 | 12/2002 |
| WO | 03/063208 A2 | 7/2003 |
| WO | 2004/034467 A2 | 4/2004 |
| WO | 2004/061859 A2 | 7/2004 |

OTHER PUBLICATIONS

U.S. Appl. No. 10/925,863, filed Aug. 24, 2004, DeHon.

Written Opinion of the International Searching Authority for the Corresponding PCT Application No. PCT/US2005/026772, issued Jul. 27, 2005 (6 pages).

International Written Opinion for the corresponding PCT Application No. PCT Application No. PCT/US03/01555, issued on Jun. 30, 2005 (7 pages).

Albrecht, O., et al., "construction and Use of LB Deposition Machines for Pilot Production," *Thin Solid Films*, vol. 284-285, pp. 152-156 (Sep. 15, 1996).

Björk. M.T., et al., "One-Dimensional Steeplechase for Electrons Realized," *Nano Letters*, vol. 2, No. 2, pp. 87-89 (2002), no month.

Brown, C.L., et al., "Introduction of [2]Catenanes Into Langmuir Films and Langmuir-Blodgett Multilayers. A Possible Strategy for Molecular Information Storage Materials," *Langmuir*, vol. 16, No. 4, pp. 1924-1930 (2000), no month.

Chen, Y., et al., "Nanoscale Molecular-Switch Crossbar Circuits," *Institute of Physics Publishing*, Nanotechnology 14, pp. 462-468 (2003), no month.

Chen, Y. et al., "Self-Assembled Growth of Epitaxial Erbium Disilicide Nanowires on Silicon (001)," *Applied Physics Letters*, vol. 76, No. 2, pp. 4004-4006 (Jun. 26, 2000).

Chou, S.Y., "Sub-10 nm Imprint Lithography and Applications," *J. Vac. Sci. Technol. B*, vol. 15, No. 6, pp. 2897-2904 (Nov./Dec. 1997).

Collier, C.P., et al., "A [2]Catenane-Based Solid State Electronically Reconfigurable Switch," *Science*, vol. 289, pp. 1172-1175 (Aug. 18, 2000).

Collier, C.P., et al., "Electronically Configurable Molecular-Based Logic Gates," Science, vol. 285, pp. 391-394 (Jul. 16, 1999).

Cui, Y., et al., "Diameter-Controlled Synthesis of Single-Crystal Silicon Nanowires," *Applied Physics Letters*, vol. 78, No. 15, pp. 2214-2216 (Apr. 9, 2001).

Cui, Y., et al., "Doping and Electrical Transport in Silicon Nanowires," *The Journal of Physical Chemistry*, vol. 104, No. 22, pp. 5213-5216 (Jun. 8, 2000).

Cui, Y., et al., "Functional Nanoscale Electronic Devices Assembled Using Silicon Nanowire Building Blocks," *Science*, vol. 291, pp. 851-853 (Feb. 2, 2001).

DeHon, A., "Array-Based Architecture for FET-Based, Nanoscale Electronics," *IEEE Transactions on Nanotechnology*, vol. 2, No. 1, pp. 23-32 (Mar. 2003).

Dekker, C., "Carbon Nanotubes As Molecular Quantum Wires," *Physics Today*, pp. 22-28 (May 1999).

Derycke, V., et al., "Carbon Nanotube Inter- and Intramolecular Logic Gates," *Nano Letters*, vol. 1, No. 9, pp. 453-456 (Sep. 2001).

Goldstein, S.C., et al., "NanoFabrics: Spatial Computing Using Molecular Electronics," *Proc. Of The 28th Annual International Symposium on Computer Architecture*, pp. 1-12 (Jun. 2001).

Gudiksen, M.S., et al., "Growth of Nanowire Superlattice Structures for Nanoscale Photonics and Electronics," *Nature*, vol. 415, pp. 617-620 (Feb. 7, 2002).

Huang, Y., et al., "Directed Assembly of One-Dimensional Nanostructures Into Functional Networks," *Science*, vol. 291, pp. 630-633 (Jan. 26, 2001).

Huang, Y., et al., "Logic Gates and Computation From Assembled Nanowire Building Blocks," *Science*, vol. 294, pp. 1313-1317 (Nov. 9, 2001).

Lauhon, L.J., et al., "Epitaxial Core-Shell and Core-Multishell Nanowire Hetorostructures," *Nature*, vol. 420, pp. 57-61 (Nov. 7, 2002).

Lieber, C.M., "Nanowire Superlattices," *Nano Letters*, vol. 2, No. 2, pp. 81-82 (Feb. 2002).

Morales, A.M., et al., "A Laser Ablation Method for the Sythesis of Crystalline Semiconductor Nanowires," *Science*, vol. 279, pp. 208-211 (Jan. 9, 1998).

Tans, S.J., et al., "Room-Temperature Transitor Based On A Single Carbon Nanotube," *Nature*, vol. 393, pp. 49-52 (May 7, 1998).

Ulman, A., "Part Two: Langmuir-Blodgett Films," *An Introduction to Ultrathin Organic Films*, Section 2.1, pp. 101-132 (1991), no month.

Whang, D., et al., "Nanolithography Using Hierarchically Assembled Nanowire Masks," *Nano Letters*, vol. 3, No. 7, pp. 951-954 (2003), no month.

Wu, Y., et al., "Block-by-Block Growth of Single-Crystaline Si/SiGe Superlattice Nanowires," *Nano Letters*, vol. 2, No. 2, pp. 83-86 (2002), no month.

Ziegler, M. M., ert al., "CMOS/NANO Co-Design for Crossbar-based Molecular Electronics Systems" *IEEE Transactions on Nanotechnology*, vol. 2, No. 4, pp. 217-230 (Dec. 4, 2004).

* cited by examiner

| $N_{inputs}$ | $N_{restore}$ | | | | | | | | |
|---|---|---|---|---|---|---|---|---|---|
| | 20 | 30 | 40 | 50 | 60 | 70 | 80 | 90 | 100 |
| 20 | 10 | 12 | 14 | 16 | 17 | 17 | 18 | 18 | 19 |
| 40 | 12 | 17 | 21 | 24 | 27 | 29 | 30 | 32 | 33 |
| 60 | 14 | 19 | 24 | 29 | 33 | 36 | 39 | 41 | 43 |
| 80 | 15 | 21 | 27 | 32 | 36 | 41 | 44 | 48 | 51 |
| 100 | 15 | 22 | 28 | 34 | 39 | 44 | 48 | 52 | 56 |
| 120 | 16 | 23 | 29 | 36 | 41 | 47 | 52 | 56 | 60 |
| 140 | 16 | 23 | 30 | 37 | 43 | 49 | 54 | 59 | 64 |
| 160 | 16 | 24 | 31 | 38 | 44 | 50 | 56 | 62 | 67 |
| 180 | 16 | 24 | 32 | 39 | 45 | 52 | 58 | 64 | 69 |
| 200 | 17 | 25 | 32 | 39 | 46 | 53 | 59 | 65 | 71 | ns
APPARATUS AND METHOD OF INTERCONNECTING NANOSCALE PROGRAMMABLE LOGIC ARRAY CLUSTERS

CROSS-REFERENCE TO RELATED APPLICATIONS

This application claims the benefit of U.S. provisional Patent Application Ser. No. 60/592,514, filed Jul. 29, 2004 for "Implementation of Computation Note 27: Working Notes on Interconnected NanoPLA Clusters" by Andre' DeHon, U.S. provisional Patent Application Ser. No. 60/610,840, filed Sep. 17, 2004 for "Design of Programmable Interconnect for Sublithographic Programmable Logic Arrays" by Andre' DeHon, U.S. provisional Patent Application Ser. No. 60/615,991, filed Oct. 5, 2004 for "Design of Programmable Interconnect for Sublithographic Programmable Logic Arrays" by Andre' DeHon, and U.S. provisional Patent Application Ser. No. 60/637,515, filed Dec. 20, 2004 for "Design of Programmable Interconnect for Sublithographic Programmable Logic Arrays" by Andre' DeHon, the disclosure of all of which is incorporated herein by reference in its entirety.

This application is a continuation in part of U.S. patent application Ser. No. 10/856,115, filed May 28, 2004 for "Nanoscale Wire-Based Sublithographic Programmable Logic Arrays" by Andre' DeHon and Michael J. Wilson, the disclosure of which is incorporated herein by reference in its entirety.

STATEMENT REGARDING FEDERALLY SPONSORED RESEARCH OR DEVELOPMENT

The present invention was made with support from the United States Government under Grant number N00014-01-0651 and N00014-04-1-0591 awarded by the Office of Naval Research of the Department of the Navy. The United States Government has certain rights in the invention.

BACKGROUND

1. Field

The present disclosure relates to programmable logic arrays (PLAs). In particular, it relates to PLA clusters and interconnections thereof.

2. Related Art

Before lithographic integrated circuits, logic was "customized" by discrete wiring (e.g. patch cables). Once lithography could support enough logic on a single chip to accommodate programmable configuration elements, it became useful to include memory elements which could configure the state of the device. As a result PALs (Programmable Array Logic), PLDs (Programmable Logic Devices), and ultimately FPGAs (Field Programmable Gate Arrays) were developed.

A PLA is a programmable device used to implement combinational logic circuits. A PLA is often said to have an "AND" plane followed by an "OR" plane. In practice, universal gates such as NAND or NOR gates are normally used. Usually, a PLA has a selective inversion capability, which makes it irrelevant whether the actual logic is NAND, NOR or AND, OR. Further, PLAs exploit DeMorgan's equivalences, so that a native NOR plane (with selective inversion) can act as a NAND plane or vice versa.

Over the past few years, many technologies have been demonstrated for molecular-scale memories. So far, they all seem to have: (1) resistance which changes significantly between "on" and "off" states, (2) the ability to be made rectifying, and (3) the ability to turn the device "on" or "off" by applying a voltage differential across the junction. An 8×8 crossbar made from rotaxane molecules has been demonstrated. It has been observed that an order of magnitude resistance difference between "on" and "off" state junctions could be forced. See, C. Collier, G. Mattersteig, E. Wong, Y. Luo, K. Beverly, J. Sampaio, F. Raymo, J. Stoddart, and J. Heath, A[2]Catenane-Based Solid State Reconfiguration Switch, Science, 289:1172-1175, 2000; C. P. Collier, E. W. Wong, M. Belohradsky, F. M. Raymo, J. F. Heath, Electronically configurable molecular-based logic gates, Science, 285:391-394, 1999.

Consequently, simple and manufacturable way of integrating restoration with programmability, and manufacturable techniques which allow wires to be tightly packed at nanoscale pitches and allow the nanoscale crosspoints to be addressed from microscale wires have been shown in U.S. patent application Ser. No. 10/856,115, filed May 28, 2004 for "Nanoscale Wire-Based Sublithographic Programmable Logic Arrays" by Andre' DeHon and Michael J. Wilson, the disclosure of which is incorporated herein by reference in its entirety.

When building large nanoPLAs, the wires in the nanoPLAs will become very long. Long nanowires are difficult to manufacture without defects and can be very slow. In particular, the nanoscale diameter wires tend to break during assembly when their length becomes many tens of microns in length. Further, the resistance of the small diameter nanowires becomes larger with the length of the nanowires making PLA operation slower.

Therefore, there is a need to be able to build large logic designs at the nanoscale while keeping the lengths of individual nanowires relatively short.

One way to build large logic is to provide interconnect between small or modest-sized logic clusters. In this way, the wires in each clusters and the wires among clusters can be kept short while the interconnected set of logic clusters implements a large logic function.

Consequently, the present application discloses how to build nanoscale PLA logic clusters and interconnect them with nanoscale interconnect. The resulting interconnected PLAs can implement arbitrary sized logic or finite-state machines while using modest-sized PLAs and moderately short nanowires. Further, the nanoscale PLA and nanoscale interconnect can all be constructed using bottom-up assembly techniques to determine the nanoscale features and provide the tight, nanoscale pitches for logic, restoration, and interconnect.

SUMMARY

According to the present disclosure, interconnection of PLA clusters is disclosed.

According to a first aspect, an array of programmable logic array (PLA) clusters is disclosed, each cluster comprising: a first plurality of nanoscale wires forming a first wired logic; a first restoring inverting arrangement connected with the first wired logic, the first restoring inverting arrangement comprising a second plurality of nanoscale wires crossing the first plurality of nanoscale wires, the first restoring inverting arrangement restoring and inverting signals of the first wired logic; and a third plurality of nanoscale wires crossing the second plurality of nanoscale wires and forming a second wired logic, wherein an output of at least one PLA cluster forms an input of at least one other PLA cluster.

According to a second aspect, a method of interconnecting a plurality of programmable logic array (PLA) clusters is disclosed, the method comprising: providing a plurality of PLA clusters each comprising: a first plurality of nanoscale wires forming a first wired logic; a first restoring inverting arrangement connected with the first wired logic, the first restoring inverting arrangement comprising a second plurality of nanoscale wires crossing the first plurality of nanoscale wires, the first restoring inverting arrangement restoring and inverting signals of the first wired logic; and a third plurality of nanoscale wires crossing the second plurality of nanoscale wires and forming a second wired logic; forming an electrical contact between an output of at least one PLA cluster and an input of at least one other PLA cluster.

According to a third aspect, an array of programmable logic array (PLA) nanoscale clusters is disclosed, wherein an output of at least one PLA cluster forms an input of at least one other PLA cluster.

According to a fourth aspect, an array of interconnected programmable logic array (PLA) nanoscale clusters is disclosed, comprising nanoscale wires adapted to perform logical functions of the individual PLA nanoscale clusters and adapted to propagate signals throughout the array.

According to a fifth aspect, a method of implementing arbitrary logic at nanoscale is disclosed, the method comprising: providing a plurality of PLA clusters each comprising: a first plurality of nanoscale wires forming a first wired logic; a first restoring inverting arrangement connected with the first wired logic, the first restoring inverting arrangement comprising a second plurality of nanoscale wires crossing the first plurality of nanoscale wires, the first restoring inverting arrangement restoring and inverting signals of the first wired logic; and a third plurality of nanoscale wires crossing the second plurality of nanoscale wires and forming a second wired logic; decomposing a logic function into logical clusters compatible with a PLA clusters; assigning each logical cluster to a PLA cluster within the plurality of PLA clusters; and configuring the array of PLA clusters to avoid defective nanowires and crosspoints while implementing each logical cluster on each assigned PLA cluster and routing signals through the plurality of PLA clusters from each PLA cluster producing a signal to each PLA cluster using a signal, including forming an electrical contact between an output of at least one PLA cluster and an input of at least one other PLA cluster.

According to a sixth aspect, a method for building a PLA cluster is disclosed, comprising: growing a plurality of nanowires; aligning a first set of nanowires in parallel on a substrate; lithographically etching breaks in the first set of nanowires; lithographically differentiating gross regions in the PLA cluster; aligning a second set of nanowires on top of and at an angle to the first set of nanowires; lithographically etching breaks in the second set of nanowires; lithographically differentiating gross regions in the nanoPLA clusters; and lithographically making contact to the nanoPLAs.

According to a seventh aspect, an array of programmable logic array (PLA) clusters is disclosed, each cluster comprising: a first plurality of nanoscale wires forming a first wired logic; a first restoring inverting arrangement connected with the first wired logic, the first restoring inverting arrangement comprising a second plurality of nanoscale wires crossing the first plurality of nanoscale wires, the first restoring inverting arrangement restoring and inverting signals of the first wired logic; and a third plurality of nanoscale wires crossing the second plurality of nanoscale wires and forming a second wired logic, wherein an output of at least one PLA cluster forms an input of at least one other PLA cluster, wherein at least one PLA cluster comprises a fifth plurality of nanoscale wires for connecting the first wired logic of the at least one PLA cluster with the third plurality of nanoscale wires of another PLA cluster, wherein routing in both of the horizontal direction (East or West, X+ or X−) is provided by using the fifth set of nanowires to cross the third set of nanoscale wires in a PLA cluster in a column to the East or West of the column where they cross the first set of nanoscale wires in a PLA cluster.

According to an eight aspect, an array of programmable logic array (PLA) clusters is disclosed, each cluster comprising: a first plurality of nanoscale wires forming a first wired logic; a first restoring inverting arrangement connected with the first wired logic, the first restoring inverting arrangement comprising a second plurality of nanoscale wires crossing the first plurality of nanoscale wires, the first restoring inverting arrangement restoring and inverting signals of the first wired logic; and a third plurality of nanoscale wires crossing the second plurality of nanoscale wires and forming a second wired logic, wherein an output of at least one PLA cluster forms an input of at least one other PLA cluster, wherein at least one PLA cluster comprises a fifth plurality of nanoscale wires for connecting the first wired logic of the at least one PLA cluster with the third plurality of nanoscale wires of another PLA cluster, wherein the fifth set of nanowires on some PLAs crosses the third set of nanowires in a PLA cluster in a column to the East of the PLA cluster in which they cross a first set of nanowires and the fifth set of nanowires on some PLAs crosses the third set of nanowires in a PLA cluster in a column to the West of the PLA cluster in which they cross a first set of nanowires.

According to a ninth aspect, an array of programmable logic array (PLA) clusters is disclosed, each cluster comprising: a first plurality of nanoscale wires forming a first wired logic; a first restoring inverting arrangement connected with the first wired logic, the first restoring inverting arrangement comprising a second plurality of nanoscale wires crossing the first plurality of nanoscale wires, the first restoring inverting arrangement restoring and inverting signals of the first wired logic; and a third plurality of nanoscale wires crossing the second plurality of nanoscale wires and forming a second wired logic, wherein an output of at least one PLA cluster forms an input of at least one other PLA cluster, wherein at least one PLA cluster comprises a fifth plurality of nanoscale wires for connecting the first wired logic of the at least one PLA cluster with the third plurality of nanoscale wires of another PLA cluster, wherein PLA clusters in some rows have their fifth set of nanowires crossing the third set of nanowires in a PLA cluster in a column to the East of the PLA cluster in which they cross a first set of nanowires and PLA clusters in some rows have their fifth set of nanowires crossing the third set of nanowires in a PLA cluster in a column to the West of the PLA cluster in which they cross a first set of nanowires.

According to a tenth aspect, an array of programmable logic array (PLA) clusters is disclosed, each cluster comprising: a first plurality of nanoscale wires forming a first wired logic; a first restoring inverting arrangement connected with the first wired logic, the first restoring inverting arrangement comprising a second plurality of nanoscale wires crossing the first plurality of nanoscale wires, the first restoring inverting arrangement restoring and inverting signals of the first wired logic; and a third plurality of nanoscale wires crossing the second plurality of nanoscale wires and forming a second wired logic, wherein an output of at least one PLA cluster forms an input of at least one other PLA cluster, wherein at least one PLA cluster comprises a fifth plurality of nanoscale wires for connecting the first wired logic of the at least one PLA cluster with the third plurality of nanoscale wires of another PLA cluster, wherein PLA clusters in even rows have their fifth set of nanowires crossing the third set of nanowires in a PLA cluster in a column to the East of the PLA cluster in which they cross a first set of nanowires and PLA clusters in odd rows have their fifth set of nanowires crossing the third set of nanowires in a PLA cluster in a column to the West of the PLA cluster in which they cross a first set of nanowires.

According to an eleventh aspect, an array of programmable logic array (PLA) clusters is disclosed, each cluster comprising: a first plurality of nanoscale wires forming a first wired logic; a first restoring inverting arrangement connected with the first wired logic, the first restoring inverting arrangement comprising a second plurality of nanoscale wires crossing the first plurality of nanoscale wires, the first restoring inverting arrangement restoring and inverting signals of the first wired logic; and a third plurality of nanoscale wires crossing the second plurality of nanoscale wires and forming a second wired logic, wherein an output of at least one PLA cluster forms an input of at least one other PLA cluster, wherein at least one PLA cluster comprises a fifth plurality of nanoscale wires for connecting the first wired logic of the at least one PLA cluster with the third plurality of nanoscale wires of another PLA cluster, wherein PLA clusters in odd rows have their fifth set of nanowires crossing the third set of nanowires in a PLA cluster in a column to the East of the PLA cluster in which they cross a first set of nanowires and PLA clusters in even rows have their fifth set of nanowires crossing the third set of nanowires in a PLA cluster in a column to the West of the PLA cluster in which they cross a first set of nanowires.

BRIEF DESCRIPTION OF THE DRAWINGS

FIG. 24 depicts a PLA performing a 2-input XOR;

DETAILED DESCRIPTION

Figure 1A:
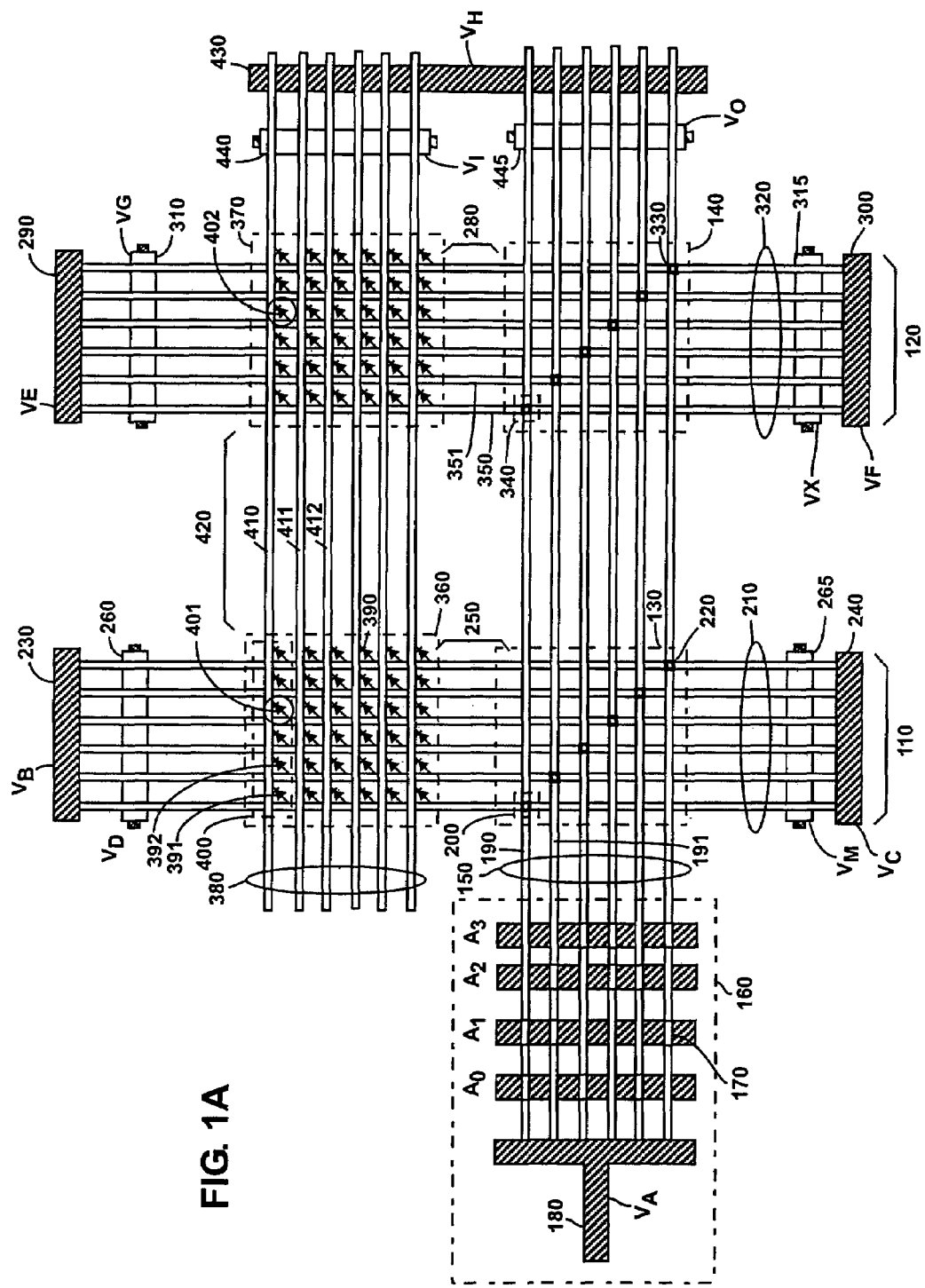
FIGS. 1A and 1B depict a single-plane sublithographic Programmable Logic Array (PLA)

FIG. 1A discloses a single-plane sublithographic PLA made with nanoscale wires.

Nanoscale wires 150, 210, 320 and 380 can be grown to controlled dimensions on the nanometer scale using seed catalysts (e.g. gold balls) to define their diameter. Flow techniques can be used to align a set of nanoscale wires 150, 210, 320 or 380 into a single orientation, close pack the nanoscale wires, and transfer the nanoscale wires onto a surface. This step can be rotated and repeated to get multiple layers of nanoscale wires such as crossed nanowires (e.g. 150, 380 cross 210, 320) for building a crossbar array or memory core. By controlling the mix of elements in the environment during growth, nanoscale wires are doped to create controllable regions 170, 220 to control nanoscale wires' electrical properties. See, Y. Cui, X. Duan, J. Hu, and C. M. Lieber, Doping and electrical transport in silicon nanowires, Journal of Physical Chemistry B, 104(22):5213-5216, Jun. 8, 2000.

The doping profile along the length of a nanoscale wire can be controlled by varying the dopant level in the growth environment over time. See M. S. Gudiksen, L. J. Lauhon, J. Wang, D. C. Smith, and C. M. Lieber, Growth of nanowire superlatice structures for nanoscale photonics and electronics, Nature, 415:617-620, Feb. 7, 2002. As a result, control over growth rate allows to control the physical dimensions of these features down to almost atomic precision. The doping profile can also be controlled along the radius of these nanoscale wires, which allows nanoscale wires to be sheathed in insulators (e.g. silicon dioxide) to control spacing between conductors and between gated wires and control wires. See, M. S. G. Lincoln, J. Lauhon, D. Wang, and C. M. Lieber, Epitaxial core-shell and core-multi-shell nanowire heterostructures, Nature, 420:57-61, 2002; D. Wang, S. Jin, and C. M. Lieber, Nanolithography using hierarchically assembled nanowire masks, Nanoletters, 3(7):951-954, Jul. 9, 2003. Conduction through controllable regions 170, 220 can be controlled via an electrical field like Field-Effect Transistors (FETs), as later explained in further detail.

As described above and shown in FIG. 1A, nanoscale wires 150, 240, 320 and 380 can be packed at a tight pitch into crossbars with programmable crosspoints 401, 402 at their junctions. Crosspoints 401, 402 which both switch conduction between the crossed wires and store their own state can be placed at every wire crossing without increasing the pitch of the crossbar array. The nanoscale wires can be individually addressed from the lithographic or nanowire scale. No lithography is required to define the nanoscale features in the crossbar; lithography or nanoscale wires are used to define the extents of the crossbar, provide addressing for bootstrap programming, and provide voltage supplies for the nanoscale wire array. The pitch of the nanoscale wires 150 is much smaller than lithographic patterning. The crosspoint programmability is used to configure logic functions into nanoscale devices. To configure logic functions into nanoscale devices, a defined voltage is selectively placed on a single row nanoscale wire 190 and column nanoscale wire 270 in order to set the state of the crosspoint 401.

A programming structure 160 allows a single nanoscale wire of the plurality of horizontal nanoscale wires 150 to be selected, for example nanoscale wire 190. Selection of the nanoscale wire 190 will allow the vertical nanoscale wires 270 and 350 to be selected. Similarly, selection of the nanoscale wire 191 will allow the vertical nanoscale wires 271 and 351 to be selected. By constructing nanoscale wires 150 with controllable regions 170 on their ends, each nanoscale wire is given an address. The dimensions of the address bit control regions 170 can be set to the lithographic or nanoscale pitch so that a set of crossed, lithographic or nanoscale wires $A_0 \ldots A_3$ can be used to address any one of nanoscale wires 150. The remaining portion of each of the nanoscale wires 150 is doped heavily enough so that the crossed lithographic or nanoscale wires $A_0 \ldots A_3$ do not affect the conduction in the remaining portion of each of the nanoscale wires 150. If all the nanoscale wires 150 are coded along one dimension of an array with suitably different codes, a unique nanoscale wire addressability is achieved, effectively implementing a demultiplexer between a small number of lithographic or nanoscale wires $A_0 \ldots A_3$ and a large number of nanoscale wires 150. Although it is difficult to control exactly which nanoscale wire codes appear in a single array or how they are aligned, a high probability of uniqueness is achieved by randomly selecting nanoscale wires from a sufficiently large code space (over 99% easily achievable). The addresses do not have to be entirely unique for this application. Redundancy will provide a tighter code space as shown in U.S. Provisional Patent Application 60/553,865, which is incorporated herein by reference in its entirety. The oxide layer between the $A_0$-$A_3$ wires and the sublithographic wires is not shown for clarity purposes.

The placement of a defined voltage Va on nanoscale wire 190 can be accomplished as follows through the depicted programming structure 160. Applying voltage Va to lithographic or nanoscale wires 180, $A_2$ and $A_3$ and applying 0 (Gnd) voltage to lithographic or nanoscale wires $A_0$ and $A_1$ will allow the voltage Va from lithographic or nanoscale wire 180 to propagate through nanoscale wire 190 only, due to the presence of doped control regions 170 on the nanoscale wire 190 in correspondence with lithographic or nanoscale wires $A_0$ and $A_1$. However, voltage Va will not propagate through the rest of nanoscale wires 150 due to the presence of doped control regions 170 in correspondence with lithographic or nanoscale wires $A_2$ and $A_3$. This process is discussed in further detail in U.S. patent application Ser. No. 10/627,405, which is incorporated herein by reference in its entirety.

Crosspoints 401 with programmable ON-OFF devices 390, for example diodes or any non-volatile device with directional or bidirectional current flow, in a crossbar array 360, 370 provide a programmable OR plane 360, 370. Each output nanoscale wire 380 in either of the OR planes 360, 370 can be programmed to perform the OR of its set of inputs. That is, there is a low resistance path between the input nanoscale wires 210 and the output nanoscale wires 410 only where the crosspoints 401 are programmed into the "on" position. If any of those input nanoscale wires 210 are high, they will be able to deliver current through the "on" crosspoint 401 and pull the output nanoscale wires 410 to a high value.

In view of the fact that the concept for OR planes 360 and 370 is the same, only operation of the OR plane 360 will be discussed in further detail.

According to the present disclosure, during programming of the sublithographic PLA, the nanoscale wires 210 are electrically connectable with nanoscale wires 380 through the ON-OFF devices 390. The nanoscale wires 210 form the inputs of the OR plane 360. In particular, the OR plane 360 allows the inputs along the 'vertical' nanoscale wires 210 to be OR-ed there between, according to the logic function that has to be implemented on the PLA. For example, if the inputs on the 'vertical' nanoscale wires 270 and 271 have to be OR-ed on the 'horizontal' nanoscale wire 410, the leftmost two diodes 391 and 392 will be ON, and the remaining diodes in the same row will be OFF. The nanoscale wires 210 are doped heavily enough so that the crossed horizontal nanoscale wires 380 do not affect their conduction. The OR plane 360 provides outputs 420. FIG. 1A also shows an ohmic contact 430 set to a voltage source Vh and a field-effect junction 440 connected to a voltage source Vi. Although only the operation of the OR plane 360 is discussed, the outputs 420 comprise inputs from both sets of restoration nanoscale wires 210 and 320.

Figures 2, 3:
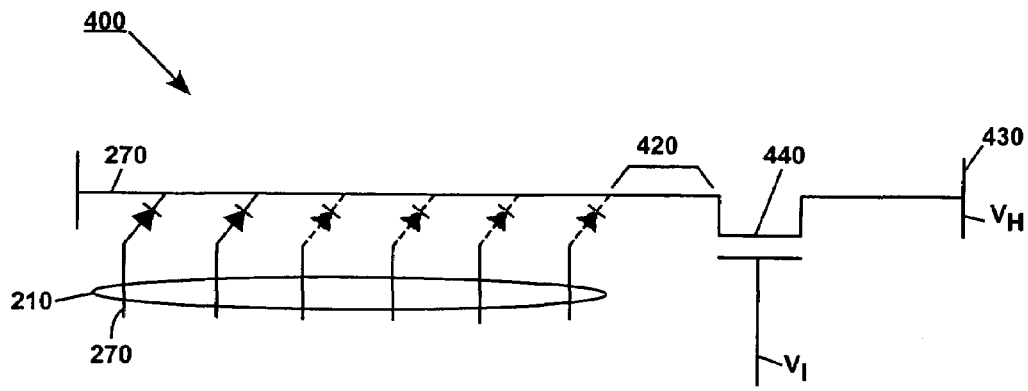
FIG. 2 depicts a unit equivalent electric circuit of the OR plane.
FIG. 3 depicts a table.

FIG. 2 shows the unit equivalent circuit 400 of a portion of the OR plane 360 of FIG. 1A. In FIG. 2, the ON-OFF devices which have been programmed ON are shown in solid lines, while the ON-OFF devices which have been programmed OFF are shown in dotted lines. Referring to circuit 400 in FIG. 2, if the input to the OR plane 360, any of the nanoscale wires 210, is high, this couples through any "ON" diode points and pulls the associated diode output lines 410 high. The strong pullup is ratioed appropriately with the weak pulldown 440 so that the pullup can drive the outputs to suitably high output voltages. Vi is used to make 440 a weak pullup. If all the inputs to the OR plane 360, nanoscale wires 210 with programmed on junctions 391, 392 are low, the succeeding ON-OFF device plane cannot be pulled high.

The input nanoscale wires 210 to the nanoscale wire 410 can only pull the line up. To evaluate a logic function (an OR) on nanoscale wire 410, the input must be allowed to be move up or down. Ohmic contact 430 can be set to a low value (e.g. ground) and can pull the line to ground. The ON-OFF devices, however, are weak and cannot pull nanoscale wire 410 very high if the nanoscale wire 410 is being pulled to ground by a strong, microscale ohmic contact 430. The FET controlled by field-effect junction 440 allows to control the effective resistance between Vh and the nanoscale wire 410. By making the effective resistance a moderately high resistance the FET acts as a weak, static pulldown resistor; alternately, by changing the value on Vi, the Vh is effectively disconnected from the output 420. A typical use, will be to pre-discharge the line by enabling conduction to ground at ohmic contact 430. Then, Vi is used to isolate ohmic contact 430 from output 420. Further, the input nanoscale wires 210 are allowed to charge or not charge line 410. If any of the input nanoscale wires 210 are high, nanoscale wire 410 is charged high. If none of the input nanoscale wires 210 are high, nanoscale wire 410 is left low (where it is discharged through ohmic contact 430). This set up allows the nanoscale wire 410 to be reset after a cycle where the output 420 of the logic is high back to a zero so that the nanoscale wire 410 can have value zero if that is the appropriate logical output on the following cycle.

Figure 1B:
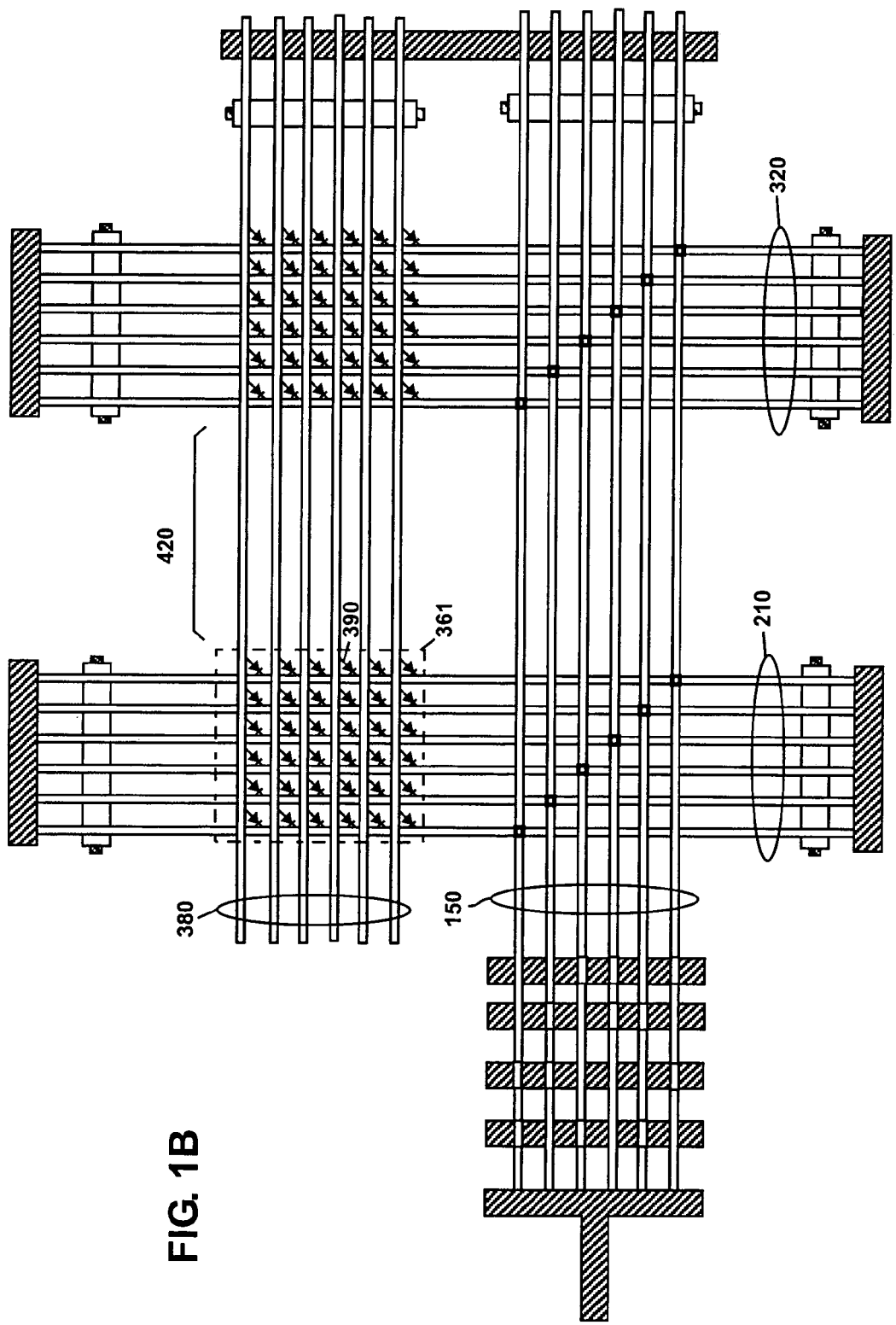

According to the present disclosure, the sublithographic PLA could be programmed to perform an AND function as shown in FIG. 1B. The nanoscale wires 210 are electrically connectable with nanoscale wires 380 through the ON-OFF devices 390. The nanoscale wires 210 form the inputs of the AND plane 361. In particular, the AND plane 361 allows the inputs along the 'vertical' nanoscale wires 210 to be AND-ed there between, according to the logic function that has to be implemented on the PLA. The nanoscale wires 210 are doped heavily enough so that the crossed horizontal nanoscale wires 380 do not affect their conduction. The AND plane 361 provides outputs 420. Although only the operation of the AND plane 361 is discussed, the outputs 420 comprise inputs from both sets of restoration nanoscale wires 210 and 320.

The AND plane 361 in FIG. 1B is set up differently than the OR plane 360 in FIG. 1A. For example, the output nanoscale wires 380 in FIG. 1B are P-type and the nanoscale wires 210 in FIG. 1B are N-type. The outputs 420 of the AND plane in FIG. 1B are charged high instead of low as discussed above for the OR plane 360. Further, the inputs nanoscale wires 150 and nanoscale wires 210 in FIG. 1B are charged high instead of low as discussed above for the OR plane 360. If any of the nanoscale wires 210 in FIG. 1B are low, the output 420 will be low. If all of the nanoscale wires 210 in FIG. 1B are high, then the output 420 remains high.

However, ON-OFF devices 390, as shown in FIG. 1A, alone do not provide arbitrary or cascadable logic. The OR gates are not universal logic building blocks. With ON-OFF devices 390 alone, the signals cannot be inverted which is necessary to realize arbitrary logic. Further, whenever an input is used by multiple outputs, the current is divided among the outputs; this cannot continue through arbitrary stages as it will eventually not be possible to distinguish the divided current from the leakage current of an "off" crosspoint 401. The ON-OFF devices 390 junction may further provide a voltage drop at every crosspoint 401 such that the maximum output high voltage drops at every stage.

The limitations of ON-OFF logic noted above are overcome by inserting rectifying field-effect restoration planes 110, 120 before OR planes 360, 370, as shown in FIG. 1A. In particular, restoration plane 110 carries logic signals which are inverted version of the inputs, while restoration plane 120 carries logic signals which are a true version of the inputs. The inputs to the structure of FIG. 1A are represented by the nanoscale wires 150, which can be stochastically assembled and addressed, as explained above.

The restoration plane 110 comprises an inversion array 130. The restoration plane 120 comprises a buffer or non-inverting array 140. The restoration plane 110 also comprises microscale contacts 230, 240 and field-effect junctions 260, 265. The restoration plane 120 also comprises microscale contacts 290, 300 and field-effect junctions 310, 315. The microscale contacts 230, 240, 290 and 300 allow supply voltage to be provided to the restoration planes 110, 120 and field-effect junctions 260, 265, 310, 315 provide control voltages to the restoration planes 110, 120 as explained later in more detail. The non-inverting restoration plane 120 provides a true logic signal through the buffer array 140 and the inverting restoration plane 110 provides a complement logic signal through the inversion array 130. Although the buffer array 140 and inversion array 130 are usually identical, the function of the buffer array 140 and inversion array 130 is controlled by properly setting up the supply and control voltages through the ohmic contacts 230, 240, 290, 300 and field-effect junctions 260, 265, 310, 315, respectively.

Besides providing the true and complement of a logic signal, the restoration arrays 110 and 120 also provide restoration of the logic signals. Signal restoration allows high signals to be driven higher and low signals to be driven lower, in order to allow an arbitrary number of devices to be cascaded together and a logical distinction between a low logical value and a high logical value to be maintained. Reference can be made, for example, to U.S. patent application Ser. No. 10/347,121, which is incorporated herein by reference in its entirety.

In accordance with the embodiment of FIG. 1A, the restoration plane 110 comprises nanoscale wires 210. The nanoscale wires 210 are arranged into an array. Each nanoscale wire 210 is coded so that it comprises an axially distributed controllable region 220 that is roughly the width of one of the crossed wires 150 which form the restoration inputs. The remaining portion of each nanoscale wire 210 is doped heavily enough so that the crossed nanoscale wires 150 do not affect the conduction of each nanoscale wire 210.

The non-inverting restoration plane 120 comprises nanoscale wires 320 that are arranged into an array. Each nanoscale wire 320 is coded so that it comprises an axially distributed controllable region 330 that is roughly the width of one of the crossed nanoscale wires 150 which form the restoration inputs. The remaining portion of each nanoscale wire 320 is doped heavily enough so that the crossed nanoscale wires 150 do not affect the conduction of each nanoscale wire 320.

Ideal restoration planes 110, 120 would be arrays of nanoscale wires where each of the nanoscale wires 210, 320 restored a different one of the nanoscale wires 150 which crossed planes 110, 120. Although selection and placement of restoration nanoscale wires 210, 320 into a restoration planes 110, 120 is not precise, useful restoration planes 110, 120 can still be defined using stochastic population technique. That is, batches of nanoscale wires are coded with control regions in the appropriate places for each of the input locations. After mixing the nanoscale wires together, the nanoscale wires are randomly selected to go into the restoration planes 110, 220. This gives a random selection of code wires. A table in FIG. 3 summarizes how many of the input lines will be restored given that there are $N_{inputs}$ nanoscale wires 150 and there are $N_{restore}$ nanoscale wires 210 in the restoration plane 110. For example, FIG. 3 shows that if there are 100 input nanoscale wires 150 and there are 100 randomly select restoring nanoscale wires 210, it should be expected that 56 different input nanoscale wires 150 would be restored.

Figure 4:
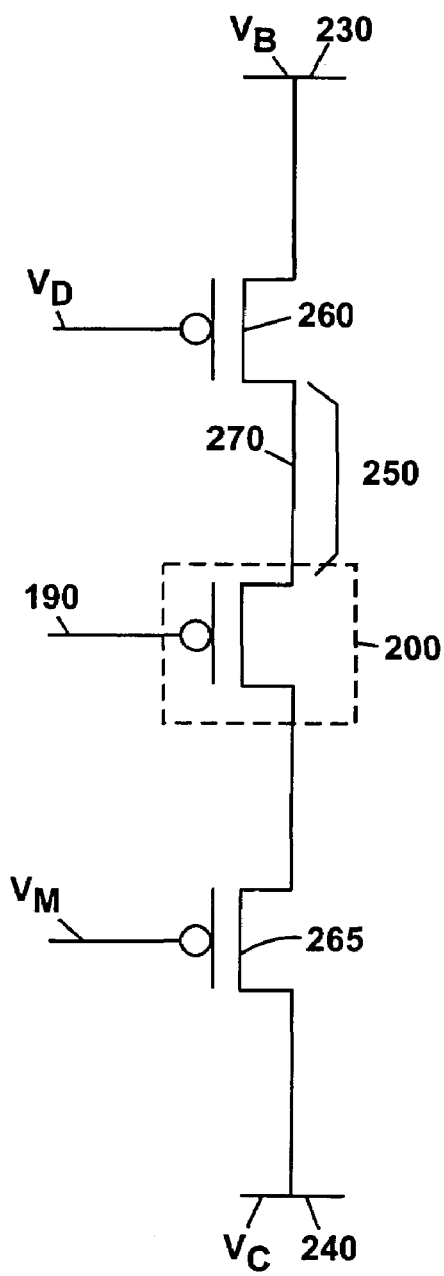
FIG. 4 depicts a unit equivalent electric circuit of the restoration plane.

FIG. 4 shows the unit equivalent electric circuit of the restoration plane 110 referred to a single nanoscale wire 270. In particular, the voltages on contacts 230, 240 are represented by values Vb and Vc, respectively, and the FET behavior of the field-effect junctions 260, 265 is represented by values Vd and Vm, respectively.

Figure 5:
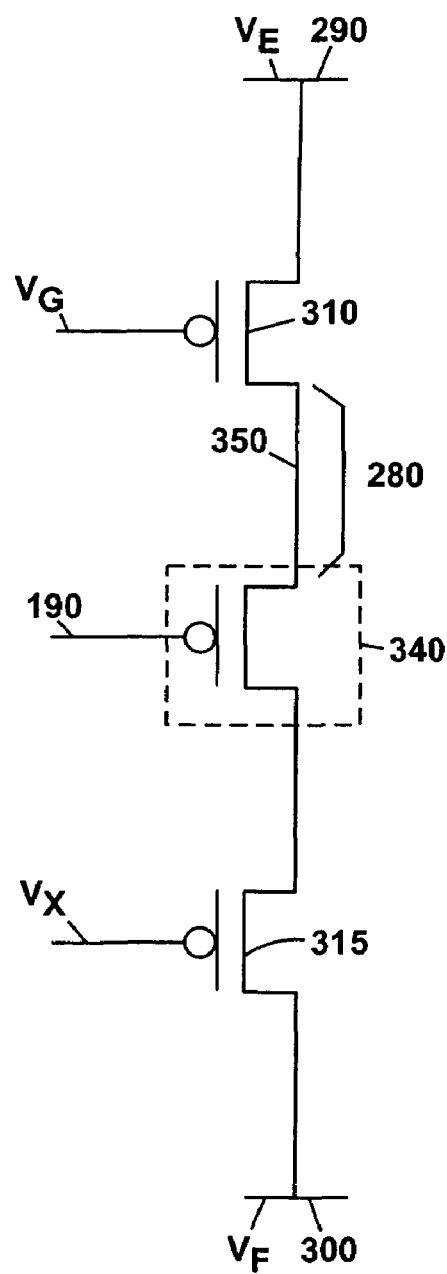
FIG. 5 depicts a unit equivalent electric circuit of the restoration plane.

FIG. 5 shows the unit equivalent electric circuit of the restoration plane 120. In particular, the voltages on contacts 290, 300 are represented by values Ve and Vf, respectively, and the FET behavior of the field-effect junction, 310, 315 is represented by a values Vg and Vx, respectively.

With reference to the inverting restoration plane 110, inverted restored outputs 250 are obtained by means of the array 130 and voltage on the ohmic contacts 230, 240 set to Gnd and Vhigh, respectively.

In particular, restoration plane 110 acts as a voltage divider between the ohmic contact 240 (set at a voltage Vhigh) and the ohmic contact 230 (set at ground voltage). The voltage divider comprises, in sequence, with reference to each nanoscale wire 210, from the bottom to the top of one of the nanoscale wires 270 of FIG. 1A, a voltage source Vhigh, a pull-up resistance Rpu formed by the doped nanoscale region 220, an output region 250, an Rpd resistance controlled by the load field-effect junction 260 at Vpd voltage, and a ground voltage on the ohmic contact 230. Therefore, the person skilled in the art will notice that the voltage at the output region 250 is:

$$Vout = \frac{Vhigh \times Rpd}{Rpd + Rpu}$$

The pull up resistance Rpu is controlled by the input signal, i.e. one of the nanoscale wires 150. If the input signal is high, Rpu is very high (depletion mode, P-type case). If the input signal is low, Rpu is low. Vpd on the field-effect junction 260 is set so that Rpd is large compared to the low voltage Rpu resistance and small compared to the high voltage Rpu resistance, that is Rpu(high voltage)>>Rpd(Vpd)>>Rpu(low voltage).

If the input voltage is low, Rpu is low, and Vout is driven close to Vhigh. On the other hand, if the input voltage is high, Rpu is high and Vout is driven close to Gnd. Therefore, the structure act like an inverter.

Figure 6:
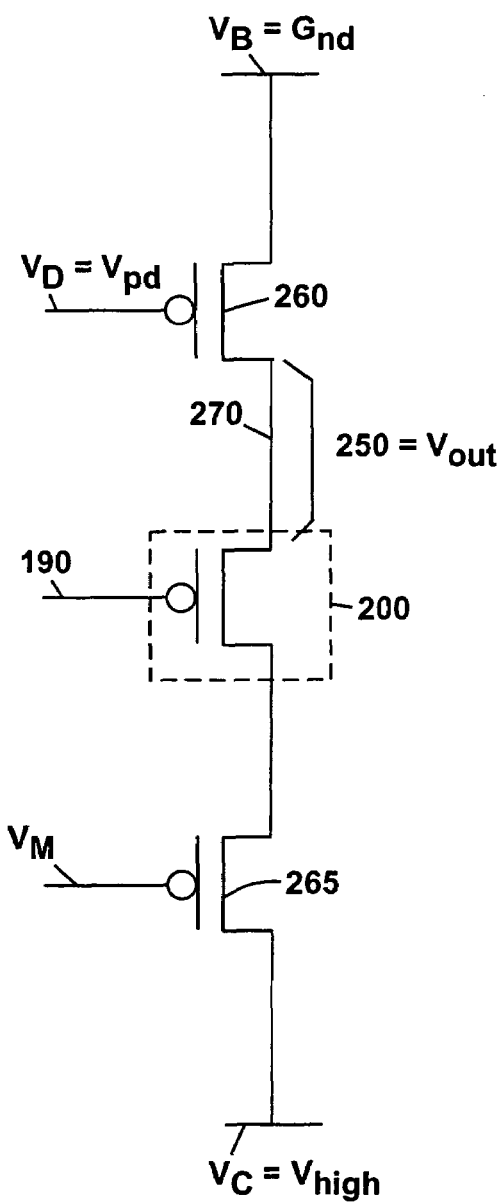
FIG. 6 depicts a unit equivalent electric circuit of the inverting restoration plane.

FIG. 6 shows the unit equivalent circuit of the above discussed voltage divider, with applied voltages Vhigh and Vpd. Referring to circuit in FIG. 6, if the input to the inverter, nanoscale wire 190, is high, it depletes carriers in the depletion-mode p-type nanowires and cuts off conduction. As a result, the nanoscale wire 270 is connected only to the weak pull down resistance Rpd and Vout is held low. When the input to the inverter, nanoscale wire 190, is low, there is current flow through the gate and the Vout is pulled high.

Figure 7:
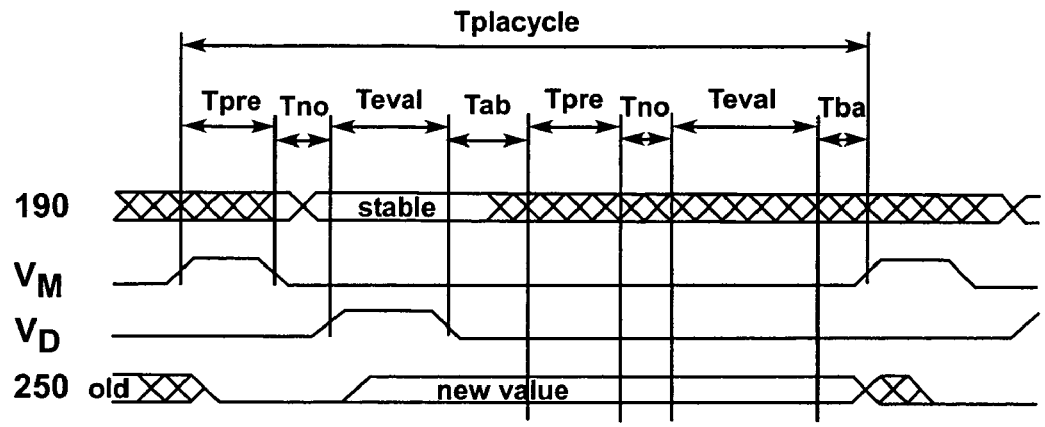
FIG. 7 depicts timing diagram of a unit equivalent electric circuit in FIG. 6.

As stated above, the conduction through controllable region 220 can be controlled via an electrical field like a Field-Effect Transistor (FET). This is demonstrated by a crosspoint 200 as depicted in FIG. 6. As fully described above, when the input to the nanoscale wire 190 is low, there is current flow through the gate at the crosspoint 200 and the Vout is held high. To prepare the output 250 for the next input from the nanoscale wire 190 the Vout must be reset to low. This is performed by grounding Vd and setting Vm high to discharge the output 250, as shown in the timing diagram of FIG. 7. As long as Vm is high, there is no current flow from the Vhigh to the Vout even if the input nanoscale wire 190 is set low. When it is time to evaluate the next input from the nanoscale wire 190, Vm is set low, at which point if the nanoscale wire 190 is set low the current will flow to the output 250 and pull it up. If, however, the nanoscale wire 190 is high, the current will not flow to the output even though Vm is allowing the conduction. Vm performs two things: 1) it makes sure that the current flow path to the high supply is off while Vd is low, this allows quick discharge and saves power; 2) it provides timing control when it is time evaluate the input from the nanoscale wires 150.

Similar considerations apply to the non-inverting restoration plane 120, where non-inverted buffered restored outputs 280 are obtained by means of the array 140 and voltage on the ohmic contact 290, 300 set to Vhigh and Gnd, respectively.

In particular, restoration plane 120 acts as a voltage divider between the ohmic contact 290 (set at a voltage Vhigh) and the ohmic contact 300 (set at ground voltage). The voltage divider comprises, in sequence, with reference to each nanoscale wire 320, from the bottom to the top of one of the nanoscale wires 350 of FIG. 1A, a voltage source Gnd, a pull-down resistance Rpd formed by the doped nanoscale region 330, an output region 280, an Rpu resistance controlled by the field-effect junction 310 at Vpu voltage, and a Vhigh voltage on the ohmic contact 290. Therefore, the person skilled in the art will notice that the voltage at the output region 280 is:

$$Vout = \frac{Vhigh \times Rpd}{Rpd + Rpu}$$

The pull down resistance Rpd is controlled by the input signal, i.e. one of the nanoscale wires 150. If the input voltage is high, Rpd is high, and Vout is driven close to Vhigh. Therefore, the structure does not act like an inverter.

Figure 8:
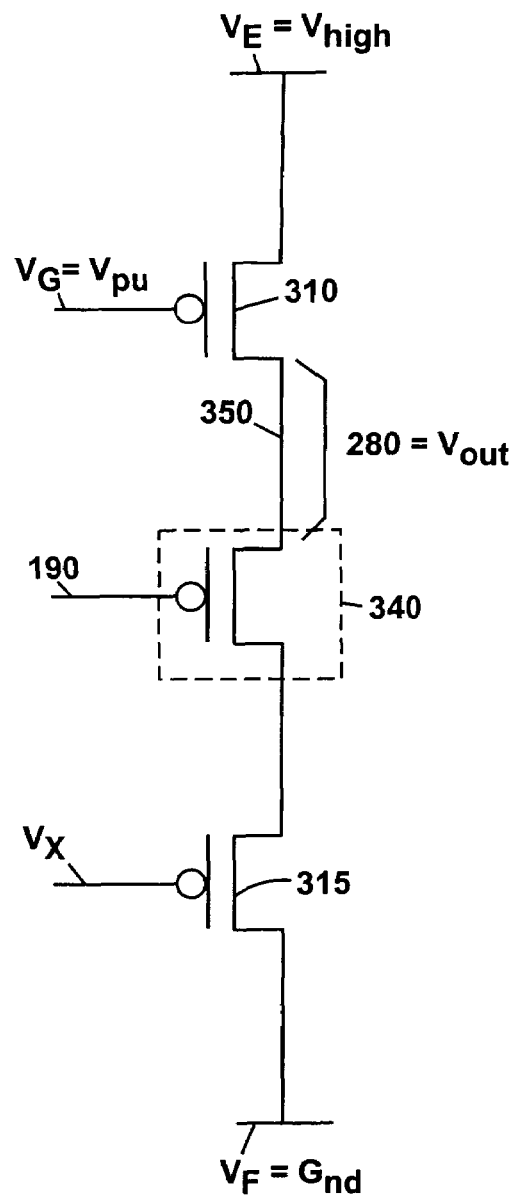
FIG. 8 depicts a unit equivalent electric circuit of the non-inverting restoration plane.

FIG. 8 shows the unit equivalent circuit of the above discussed voltage divider, with applied voltages Vhigh and Vpd. The non-inverting buffer circuit in FIG. 8 behaves in a manner which is opposite to inverting circuit in FIG. 6. By taking Vout from the Vhigh side of the buffer input gate, the Vout is coupled to Vhigh when buffer input, nanowire 190, is high and Vout is coupled to the Gnd when buffer input, nanowire 190, is low.

Figure 9:
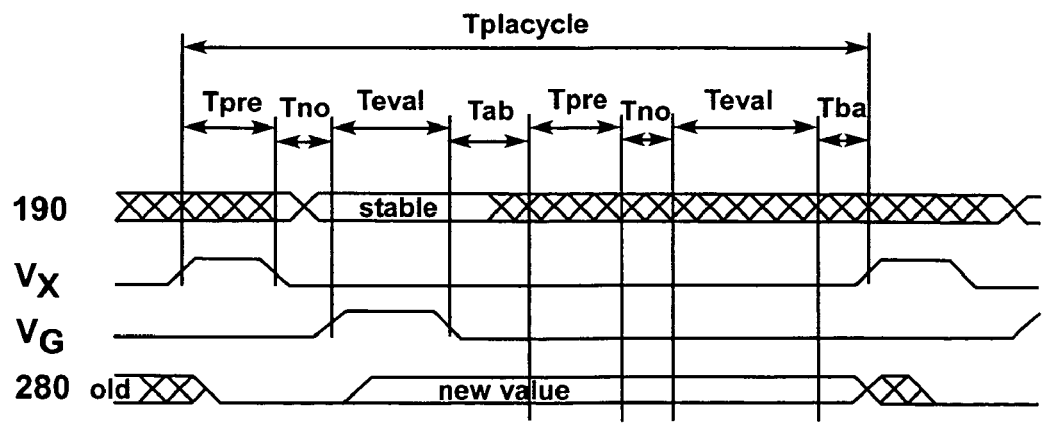
FIG. 9 depicts timing diagram of a unit equivalent electric circuit in FIG. 8.

As stated above, the conduction through controllable region 220 can be controlled via an electrical field like Field-Effect Transistors (FETs). This is clearly demonstrated by the crosspoint 340 as depicted in FIG. 8. As fully described above, when the input to the nanoscale wire 190 is low and Vx is low, there is current flow through the gate at the crosspoint 340 and the Vout is pulled low. To prepare the output 280 for the next input from the nanoscale wire 190 the Vout must be reset to high. This is performed by grounding Vg and setting Vx high to charge the output 280, as shown in the timing diagram of FIG. 9. As long as Vx is high, there is no current flow from the Gnd to the Vout even if the input nanoscale wire 190 is set low. When it is time to evaluate the next input from the nanoscale wire 190, Vx is set low, at which point if the nanoscale wire 190 is set low the current will flow from the output 280 and pull it down.

If, however, the nanoscale wire 190 is high the current will not flow from the output even though Vx is allowing the conduction. As Vm described above, Vx performs two things: 1) it makes sure that the current flow path to the low supply is off while Vd is low, this allows quick discharge and saves power; 2) it provides timing control when it is time evaluate the input from the nanoscale wires 150.

Figure 10:
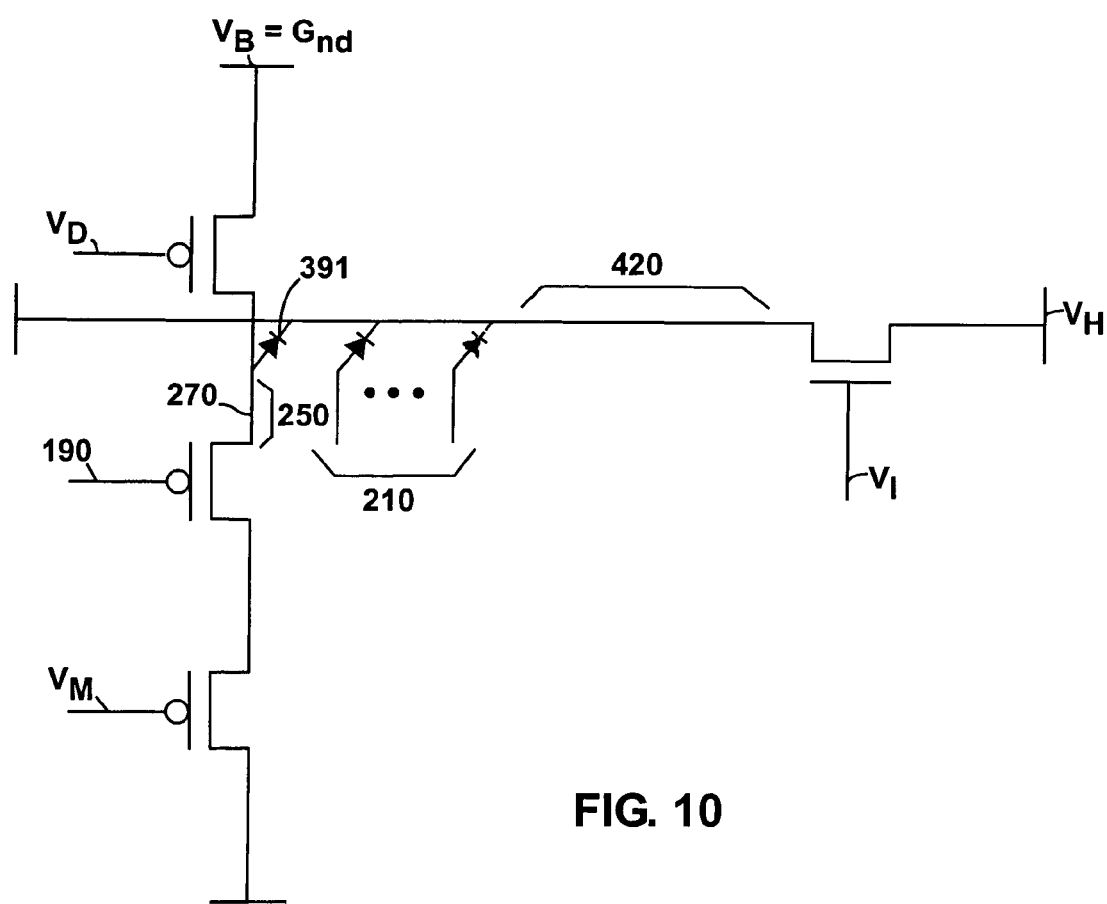
FIG. 10 depicts unit equivalent circuit of inverting plane in series with the OR plane.
Figure 11:
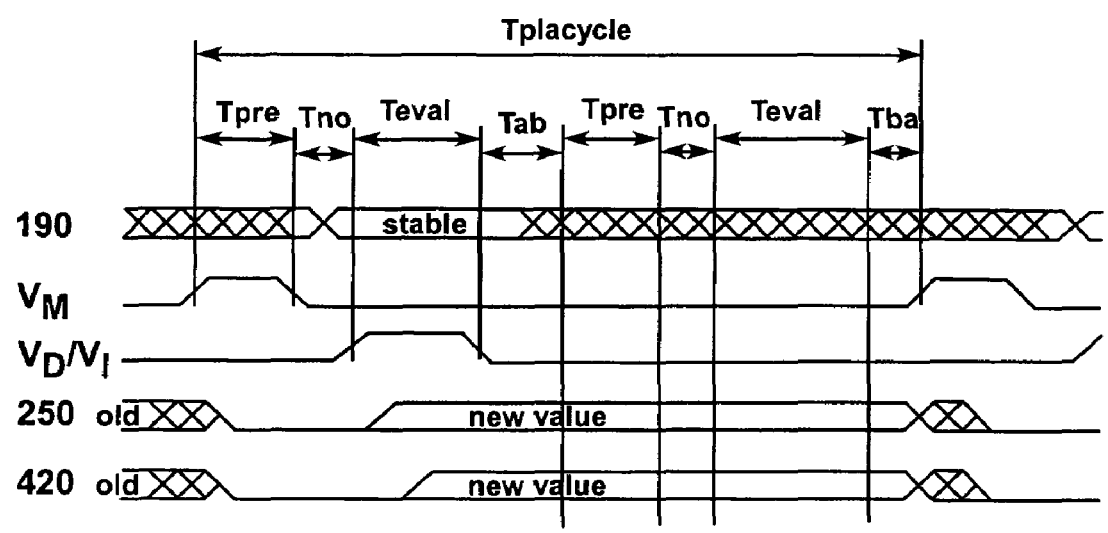
FIG. 11 depicts timing diagram of a unit equivalent electric circuit in FIG. 10.

FIG. 10 shows the unit equivalent circuit discussed above in FIG. 6 in series with the unit equivalent circuit discussed above in FIG. 2. The timing diagram of FIG. 11 depicts how a value on input nanoscale wire 190 propagates through the inverting plane 130, OR plane 360 to the output 420 in the unit equivalent circuit in FIG. 10.

Figure 12:
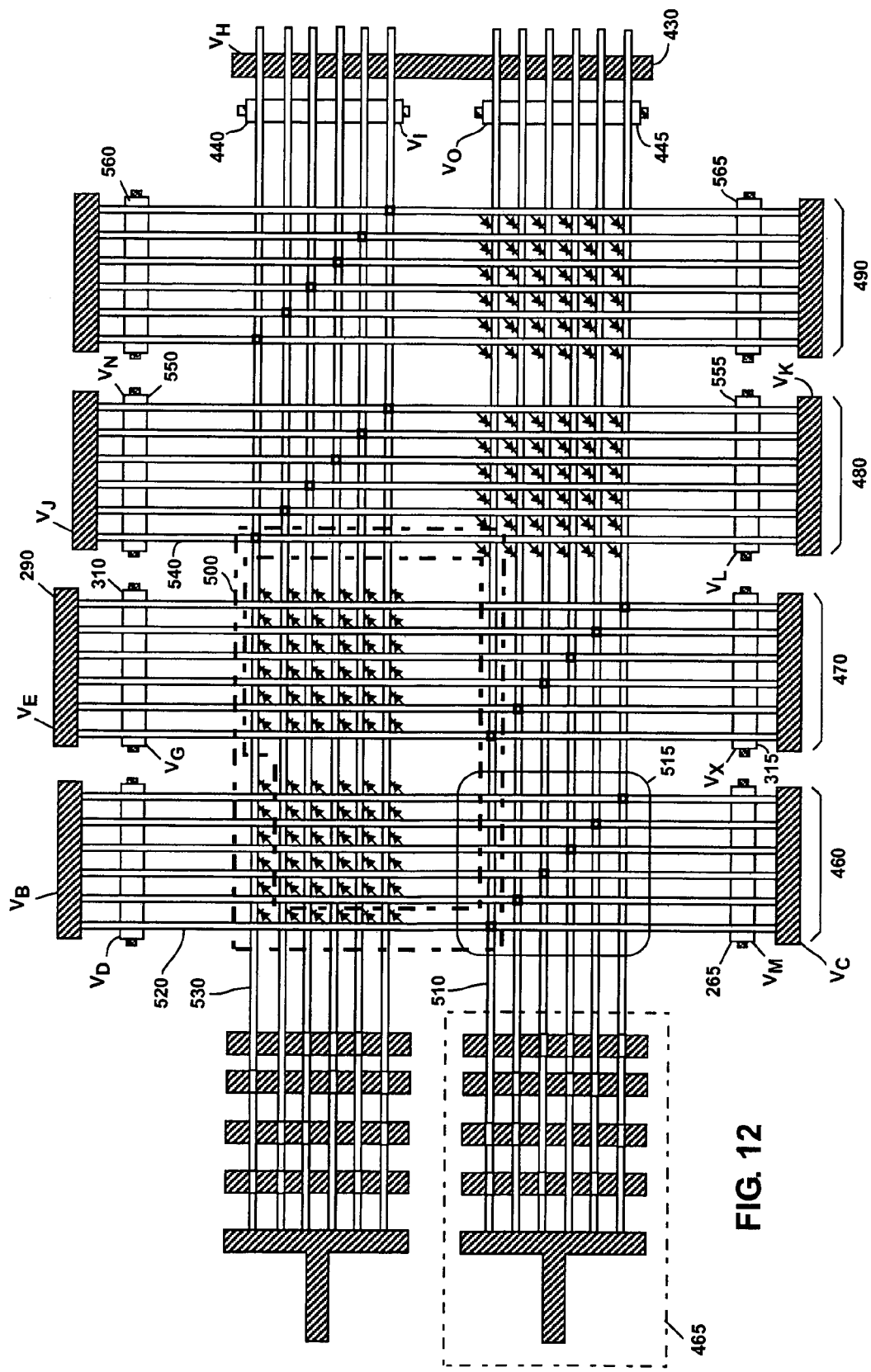
FIG. 12 depicts a two-plane sublithographic PLA.

FIG. 12 is based on the one-plane structure of FIG. 1A and discloses a two-plane structure. The two-plane structure of FIG. 12 comprises four restoring stages 460, 470, 480 and 490. Wherein restoring stages 460 and 480 are inverting stages and restoring stages 470 and 490 are non-inverting stages.

Figure 13:
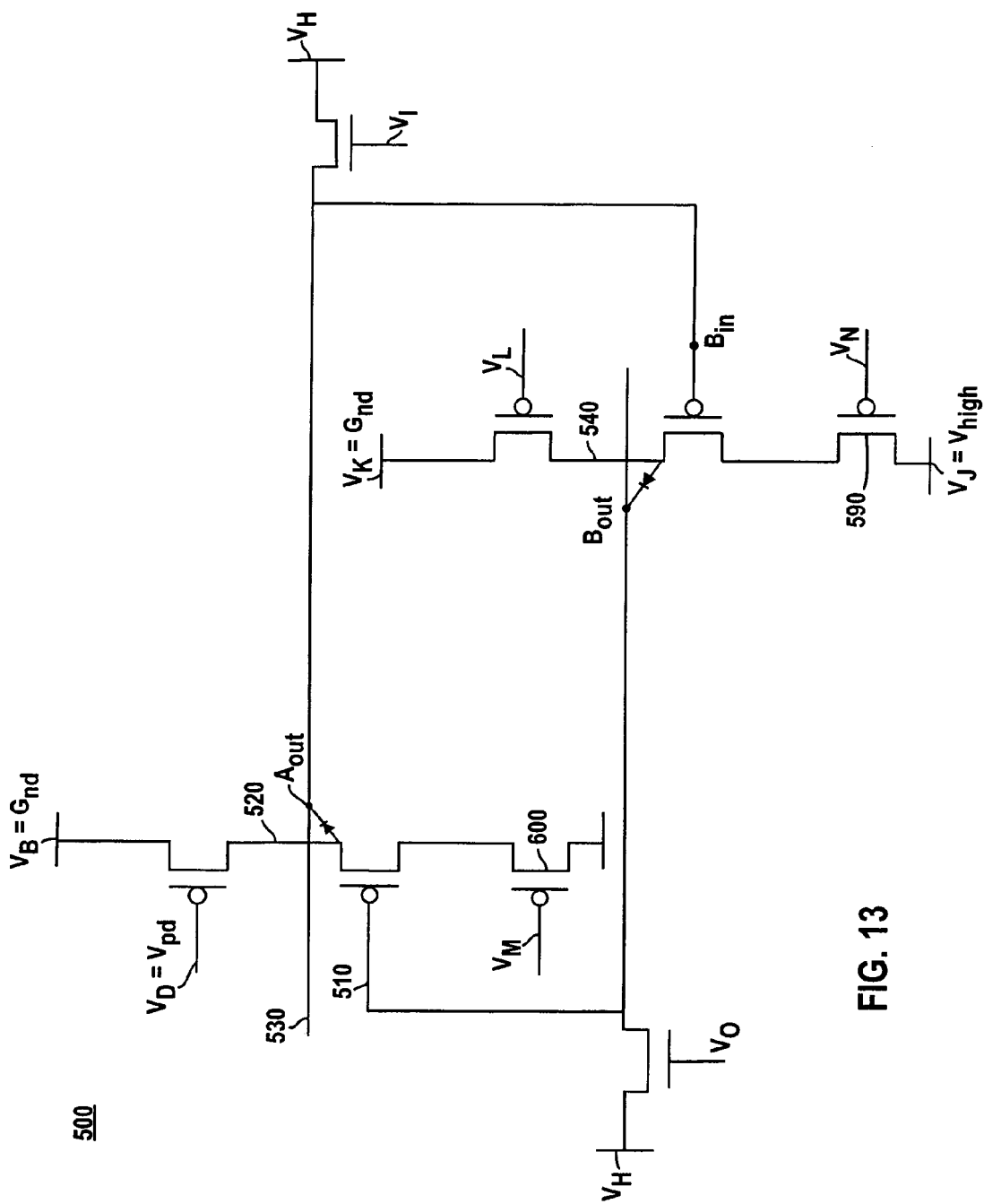
FIG. 13 depicts a unit equivalent electric circuit of the two-plane PLA.
Figure 14:
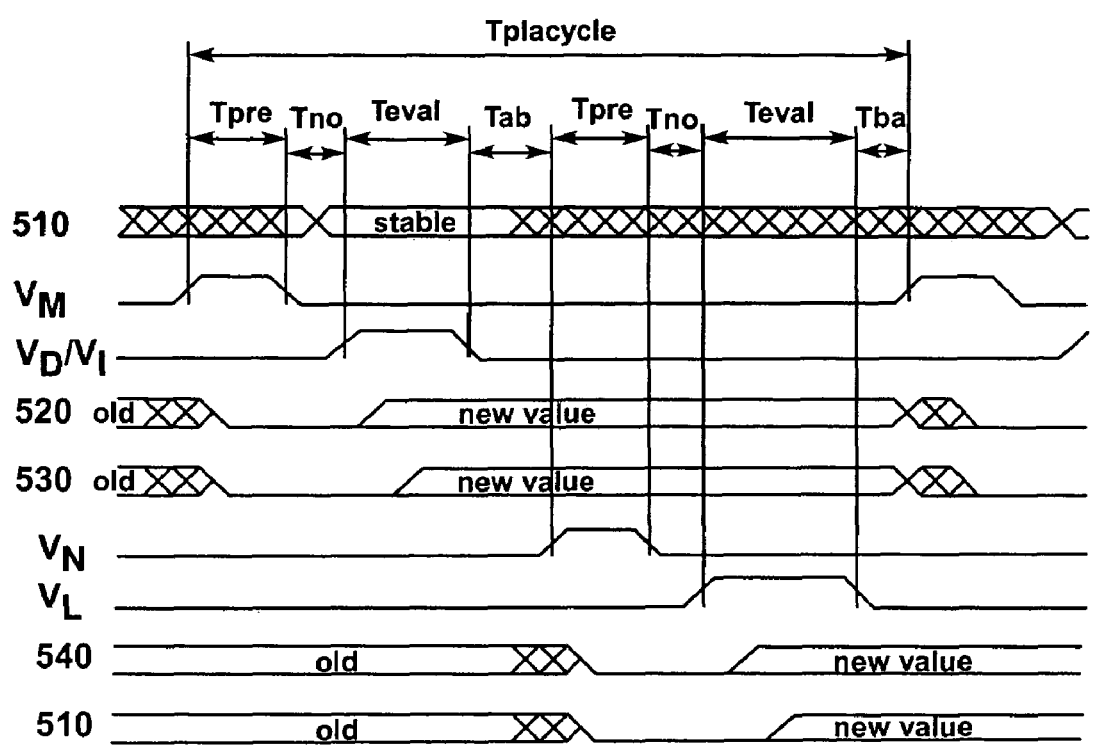
FIG. 14 depicts timing diagram of a unit equivalent electric circuit in FIG. 13.

A unit equivalent circuit 500 of the two-plane PLA is depicted in FIG. 13. The timing diagram of FIG. 14 depicts how a value on input nanoscale wire 510 propagates through the inverting plane 515, OR plane 516, inverting plane 517, OR plane 518 and back to input nanoscale wire 510 in the unit equivalent circuit in FIG. 13.

A person skilled in the art will notice that the cyclic arrangement shown in FIG. 13 and realized by the organization in FIG. 12 can be viewed as a pair of latched gates. The pair of latched gates can be used to provide clocked logic. The separate controls (Vd, Vm, and Ve, Vn) allow the logic to be evaluated in a 2-phase form, similar to a conventional 2-phase clocking scheme. Consequently, the cycle in FIGS. 12 and 13 provides a clocking capability.

Further, one skilled in the art will notice that the above arrangement can be viewed as a programmable NOR-NOR (AND-OR) plane followed by a clocked register. As such, the arrangement can be used to implement clocked logic, including finite-state machines. The PLAs according to the present disclosure are capable of implementing combinational logical functions and implementing finite-state machines.

The area efficiency of the PLAs can also be addressed by optimization techniques such as sharing of programmable decoders among arrays and implementation of logic in more than two levels or planes.

The programming structure 465 can occupy a significant fraction of the area of the nanoPLA. Notably, if the structure allows addressing from microscale wires, the large pitch of the microscale wires relative to the nanoscale wires in the array, will, as a consequence, increase the dimension of the programming structure. However, a large dimension of the programming structure is tolerable with large nanoPLAs, i.e. PLAs having a large number of wires in the 460, 470, 480, 490 columns.

Figure 15:
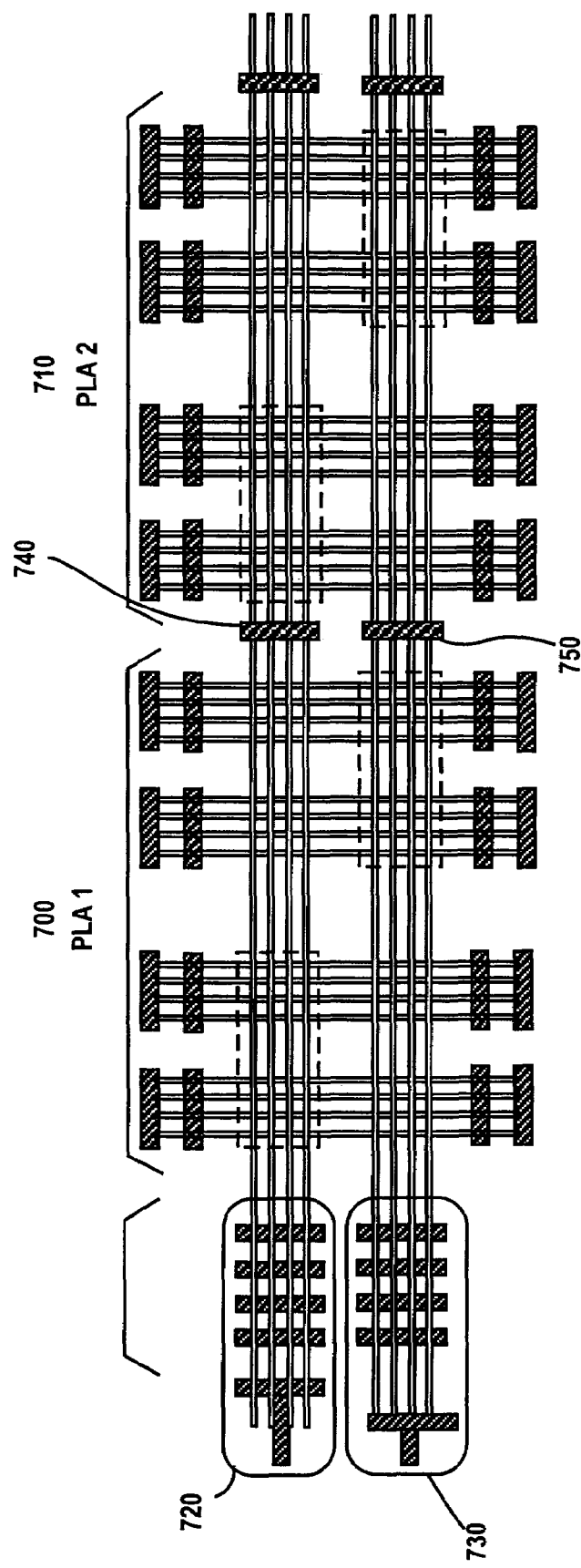
FIG. 15 depicts two two-plane sublithographic PLAs sharing the same programming structure.

Alternatively, the programming structure can be shared among multiple nanoPLAs. Referring to FIG. 15, two two-plane PLAs 700 and 710 can share the same programming structures 720 and 730. Isolation transistors 740 and 750 serve to electrically separate the row segments of the planes during operation. However, during programming, the isolation transistors 740 and 750 allows the programming structures 720 and 730 to address all of the PLAs. In the embodiment of FIG. 15, all rows on the same phase can be pulled down simultaneously. A single supply connection can be used to set all of the rows low simultaneously, then isolate the rows for the next logic evaluation. This will allow to put charge on all the individual segments of such a shared group of wires (and there could be more than 2 groups sharing the programming and precharge lines) 1) during programming, and 2) during precharge. During the rest of time the isolation transistors 740, 750 are used to keep the OR functions independent. Preferably, all segments will be be precharged at once, i.e. at the same time and all to the same value. So, during the precharge phase, the isolation transistors 740, 750 are set to allow conduction and precharge everyone. After all segments are pulled low, the isolation transistors 740, 750 are used to isolate the segments.

A second option for area reduction is to compute using multiple levels of logic. It is well known that many common functions require an exponential number of product terms when forced to two-level form, whereas the functions can be implemented in a linear number of gates (e.g. XOR). Research on optimal PLA block size to include in conventional, lithographic FPGAs suggests PLA blocks contain modest (e.g. 10) product terms and programmable interconnect. However, the fact that it is desired to amortize out the lithographic programming lines to get the benefits of sublithographic PLAs will likely shift the beneficial PLA size to larger numbers of product terms.

Figure 16:
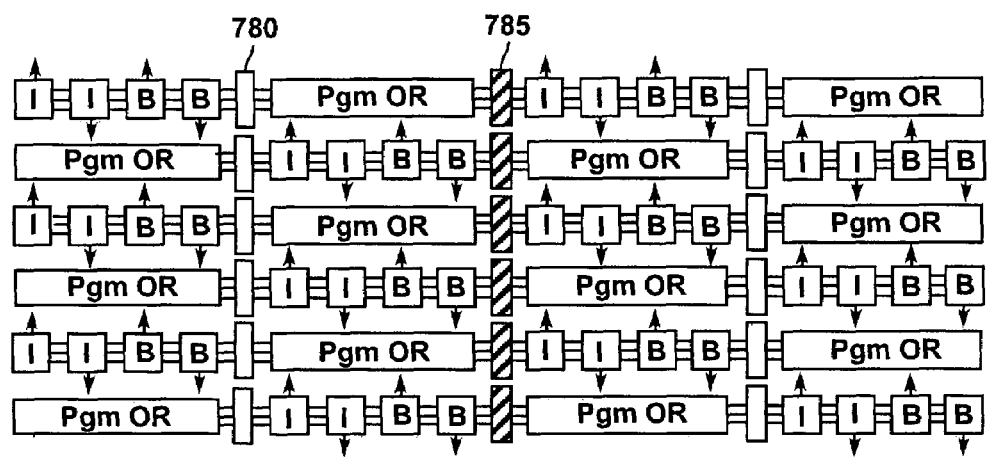
FIG. 16 depicts an array of 6 single-plane PLAs.
Figure 17:
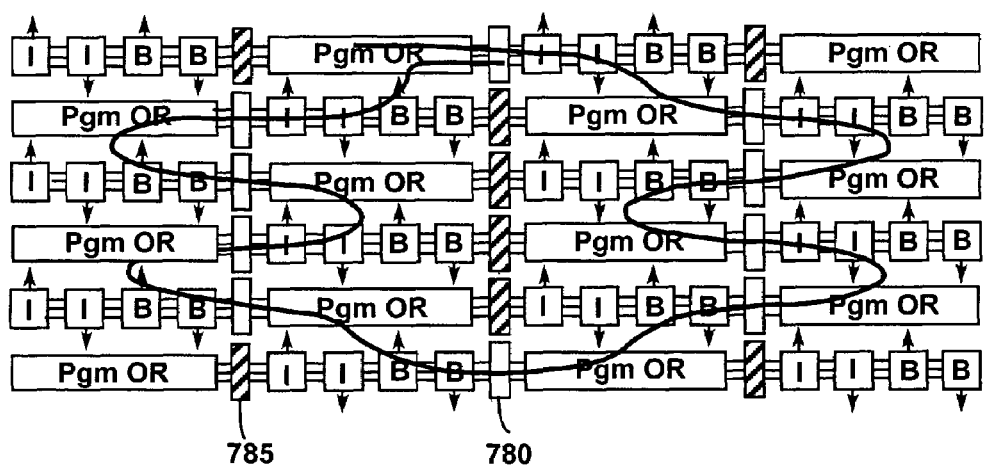
FIG. 17 depicts an array of 10 single-plane PLAs.

Although individual PLA clusters can be interconnected using isolation transistors 780, 785 as shown in FIGS. 16, 17, there are a number of other interconnect variants that could be used to interconnect a plurality of single-plane PLA clusters. The key idea for interconnecting PLA clusters is to overlap restored output nanowires from each PLA cluster with the programmable-OR input region of an adjacent PLA cluster. This means that each PLA cluster may receive inputs from a number of different PLA clusters. With multiple input sources and outputs routed in multiple directions the PLA clusters may also serve as switching blocks, which means that an array of PLA clusters may be configured to route signals between any PLA cluster within the array.

Figure 18:
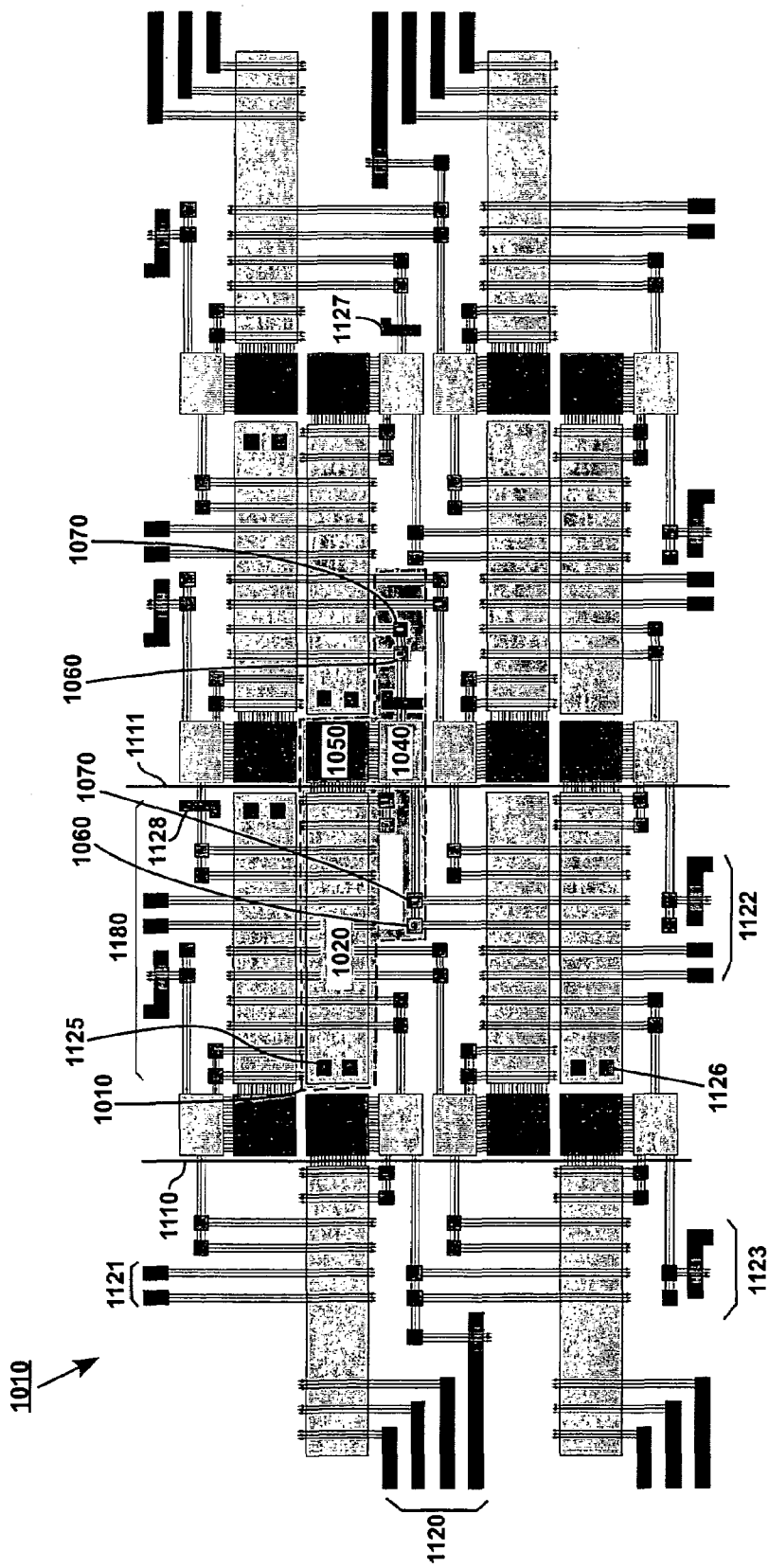
FIG. 18 depicts a PLA array composed of plurality of interconnected PLA clusters.
Figure 19:
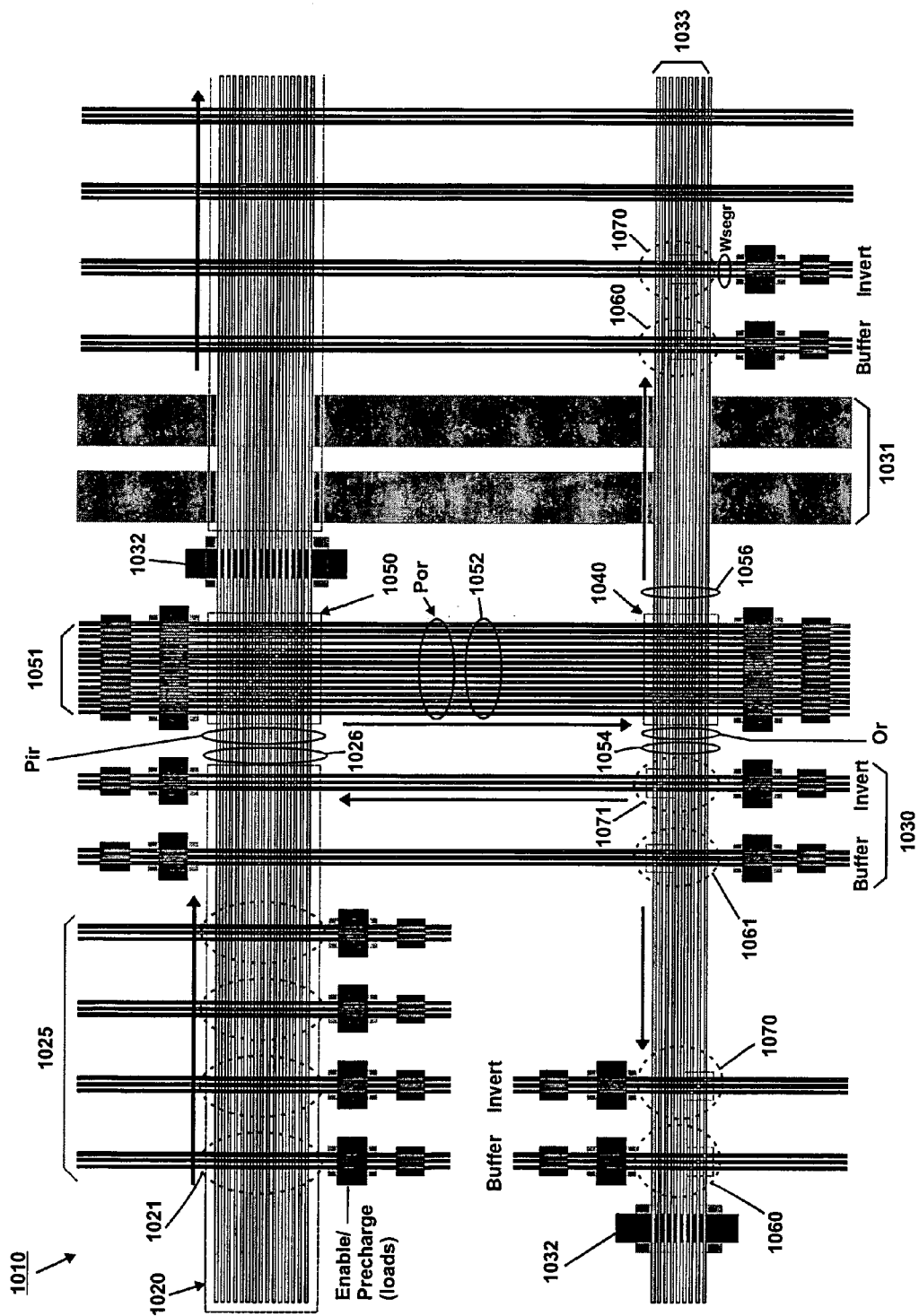
FIG. 19 depicts a PLA cluster from the PLA array in FIG. 18.

An exemplary embodiment of a PLA array 1000 composed of interconnected PLA clusters 1010 is shown in FIG. 18. As shown in FIG. 19, the PLA cluster 1010 may contain wired logic region 1020, feedback signals 1030, wired-OR region (OR plane) 1040, internal inversion and restoration region 1050, buffered (non-inverting) output regions 1060, and inverting output regions 1070. The PLA cluster 1010 may also contain a reserved channel space 1031 for feedback on adjacent block and isolation gating devices 1032. The wired logic region 1020 may be a wired-OR or a wired-AND logic region.

Wired Logic Region 1020 of PLA Clusters 1010:

Wired logic regions 1020 of PLA clusters 1010 contain one or more regions of programmable crosspoints 1021 within PLA clusters 1010 that serve as the input to the PLA clusters 1010. The inputs 1025 to the wired logic region 1020 are restored output nanowires from a number of different PLA clusters. The programmable crosspoints 1021 allow the selection of inputs 1025 that participate in each logical product term.

Internal Inversion and Restoration Region 1050 of PLA Clusters 1010:

The nanowire outputs 1026 from the wired logic region 1020 cross a set of orthogonal nanowires 1051 that are coded with a single, field-effect controllable region. The nanowires 1051 may comprise P-type nanowires. The field-effect region of each nanowire within nanowires 1051 allows conduction through each crossed nanowire 1051 to be gated by a single nanowire input. The output nanowires 1052 of internal inversion and restoration region 1050 are oxide coated and only load the inputs, i.e. the nanowire outputs 1026, capacitively such that the inputs, i.e. the nanowire outputs 1026, are isolated from the outputs 1052. The internal inversion and restoration region 1050 may be arranged to be inverting so as to provide the logical NOR of the selected input signals into the second plane of the PLA cluster 1010.

Output Wired-OR Region 1040 of PLA Clusters 1010:

The restored outputs 1052 from the internal inversion and restoration region 1050 become inputs to a second, programmable crosspoint region within output wired-OR region 1040. Each nanowire in the internal inversion and restoration region 1050 computes the wired OR of one or more of the restored output 1052.

Buffered (Non-Inverting) Output Regions 1060 and Inverting Output Regions 1070 of PLA Clusters 1010:

Outputs 1054, 1056 of the output wired-OR region 1040 are restored and inverted by the buffered output regions 1060 and inverting output regions 1070. The buffered output regions 1060 provide the non-inverted version of the outputs 1054, 1056 and the inverting output regions 1070 provide the inverted version of the outputs 1054, 1056. Taken together, the buffered output regions 1060 and inverting output regions 1070 provide NOR-NOR logic. This is logically equivalent to an OR-AND arrangement. With the selective inversion on the outputs 1054, 1056, it is possible to strategically invert the signals and use the appropriate DeMorgan's equivalents to view this as a conventional AND-OR PLA cluster 1010. The outputs 1054, 1056 may comprise N-type nanowires 1033.

The buffered output regions 1060 usually do not perform as well as the inverting output regions 1070 because buffered non-inverting output regions 1060 are slower and not amenable to precharge. One alternative is to compute the logic in dual rail form, discussed below, so that selective inversion comes just by swapping the true and complement sense of a computed signal. Although the dual-rail case saves the cost of the second restoration column, the dual-rail case has more outputs and P-terms to compute.

Feedback Signals 1030 of PLA Clusters 1010:

One set of outputs 1054 may be fed back to wired logic region 1020 with feedback signals 1030. The feedback signals 1030 serve the role of intra-cluster routing similar to internal feedback in conventional, Island-style FPGAs. The PLA cluster 1010 implements registers by routing output signals 1054 through the feedback signals 1030; with separate precharge and evaluation of each of the planes, the register design is similar to two-phase clocked register design in conventional VLSI circuits. Output signals 1054 may be routed through the feedback signals 1030 multiple times to form long register delay chains for data retiming.

Implementing feedback with feedback signals 1030 when interconnecting PLA clusters 1010 may be appropriate for cases where computations within each PLA cluster are performed in cycles before going out onto the general interconnect. When implementing feedback, the output wired-OR region 1040 may be used for crossbar input selection. By providing buffered (non-inverting) output region 1061 and inverting output region 1071 full selective inversion is provided at the cost of additional Y routing channel width 1180 discussed below. However, interconnecting PLA clusters without feedback on the other hand allows looped feedback through the Y routing channel 1180 that is not shown in a single figure in detail, but that will be readily understood to the person skilled in the art upon reading of the present disclosure.

Y Route Channels 1180:

With each PLA cluster 1010 producing outputs 1060 and 1070 that run one or more PLA cluster heights above or below the PLA cluster 1010, vertical routing channel 1180 is obtained between the logic cores of the PLA clusters, as shown in FIG. 18. The vertical routing channels 1180 allow a signal to pass a number of PLA clusters 1010. For longer routes, the signal may be switched and rebuffered through a PLA clusters 1010, as shown in FIG. 20.

Figure 20:
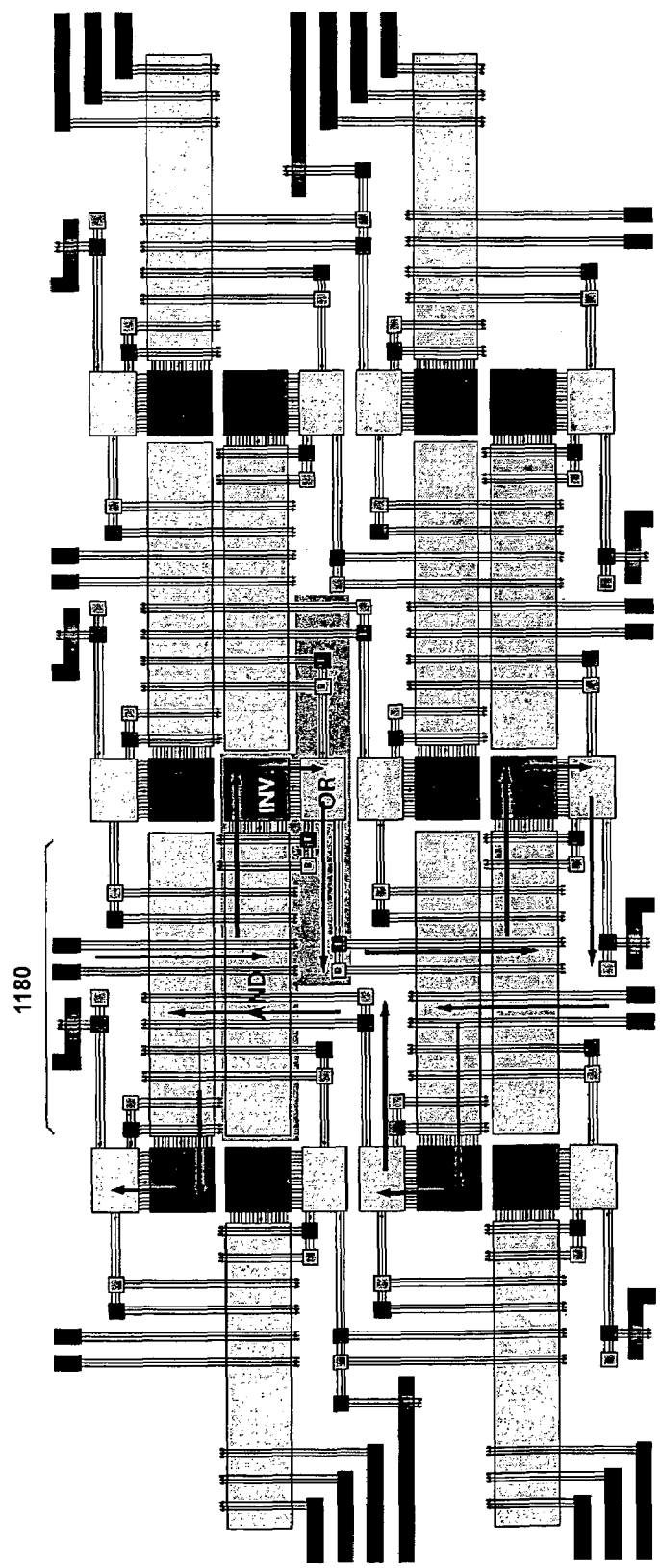
FIG. 20 depicts routing in the Y direction through the PLA array in FIG. 18.
Figure 21:
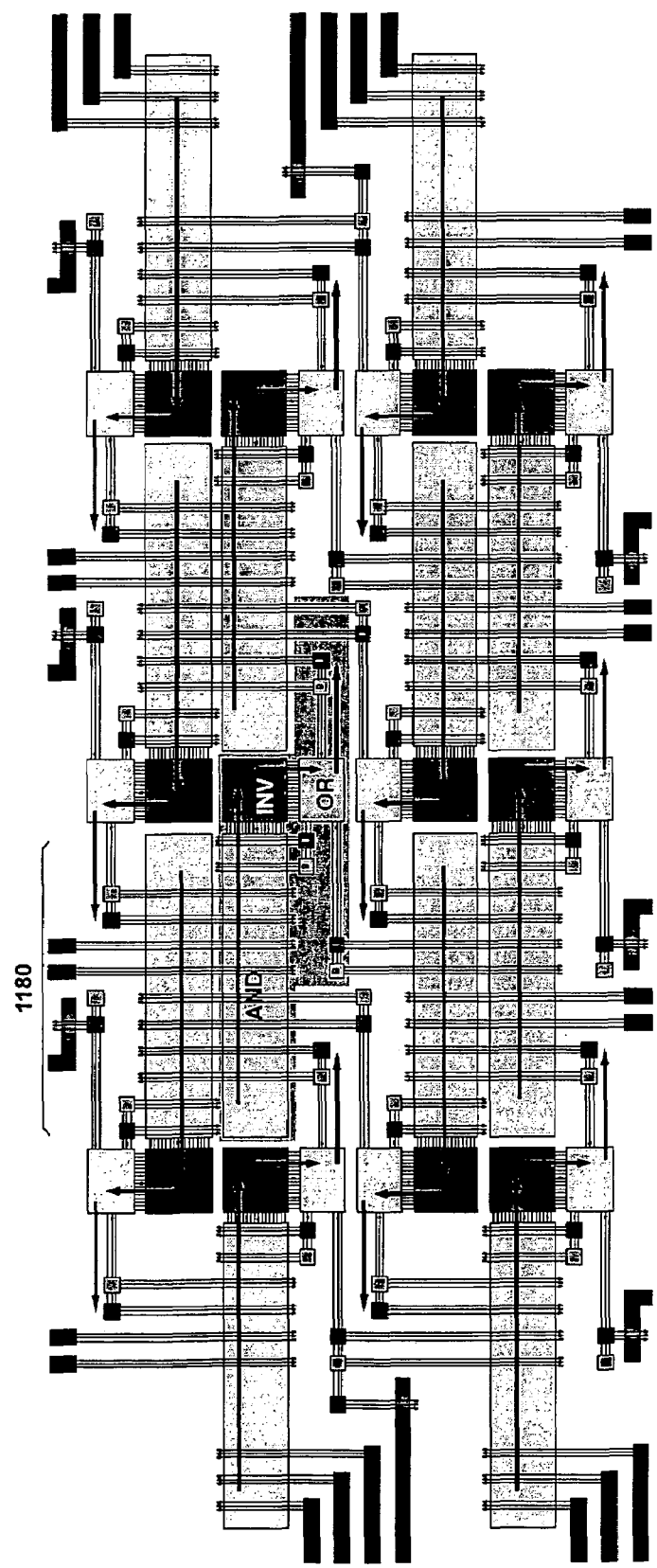
FIG. 21 depicts routing in the X direction through the PLA array in FIG. 18.

While Y route channels 1180 are immediately obvious in FIGS. 18 and 20, the X route channels are less apparent. As shown in FIG. 21, one output group is placed on a side of the PLA cluster 1010 that is opposite to the input. In this way, one can route in the X direction by going through a logic block and configuring the signal to drive a nanowire in the output group on the opposite side of the input. If all X routing blocks had their inputs on the left, then we would only be able to route from left to right. To allow both left-to-right and right-to-left rollting, we alternate the orientation of the inputs in alternate rows of the nanoPLA array. In this manner, even rows provide left-to-right routing while odd rows allow right-to-left routing.

Soft-Error Checking:

Additional logic (not shown) may be added to the PLA clusters 1010 to check for single errors in the outputs 1054, 1056. If the logic is dual-rail, then it may be simple to just check for a proper, complementary pair. If the logic is using parity or parity groups, then the parity is checked. Although this may not change the general shape of the PLA cluster, it may affect how the PLA cluster is used.

Dual-Rail Interconnect

With dual-rail interconnect, a true and a complement of the signal is routed from the first PLA cluster 1010 to the second PLA cluster 1010. The second PLA cluster 1010 can check that the pair of signals matches in parallel with starting the computation on the data. This would most likely be employed with a Dual-Rail calculation scheme that is performing soft-error detection. This need not change the interconnect organization or the interconnect requirements, just the logic requirements to perform logic in dual rail form.

Fault-Tolerant Nanoscale Addressing

Nanoscale wires may also be used for address programming, instead of microscale wires used in the programming structures 160 disclosed above, by employing a binary-reflected code to tolerate errors.

Programming Structure

In the simple PLA clusters discussed above, the programming structures 160 were placed at one end of the nanowire runs. However, with overlapping and staggered signal runs in the PLA array 1000, it may be beneficial to use periodic vertical programming stripes 1110, 1111 that cross multiple rows of nanowire groups, as shown in FIG. 18. As such, the programming stripes 1110, 1111 cross some nanowire groups on the ends, but many nanowire groups may be crossed the middle. This effect may be exacerbated with heavier sharing. The key observation is that one should be able to drive the supply voltages on either end of a contiguous nanowire run. The region between the address region and the supply voltage is not controllable, but ends can be swapped to address each half of the nanowire. It may be possible to control which actual crosspoints are active by selectively energizing columns, so as to avoid programming crosspoints on the current supply side of the address nanowires by making sure those columns are not activated.

Microscale IOs

To interface between the PLA array 1000 and the microscale world, a hybrid hierarchy scheme may be used where microscale lines are connected to the nanowires or a collection of nanoscale lines are used to gate a microscale line. Similar to conventional interfacing between the microscale and the milliscale for Printed Circuit Boards (PCBs) and Multi-Chip Modules (MCMs), interconnection of the microscale lines to the nanowires may be preformed on the edges of the PLA array 1000, i.e. edge IOs shown in FIG. 18 by microscale lines 1120, 1121, 1122, 1123 or may be preformed throughout the PLA array 1000, i.e. area IOs, as shown in FIG. 18 by microscale lines 1125, 1126, 1127, 1128. With multiple metal layers to carry and distributed signals for the microscale interconnect, the "area IO" option may be more easily implemented than milliscale interfacing.

Figure 22:
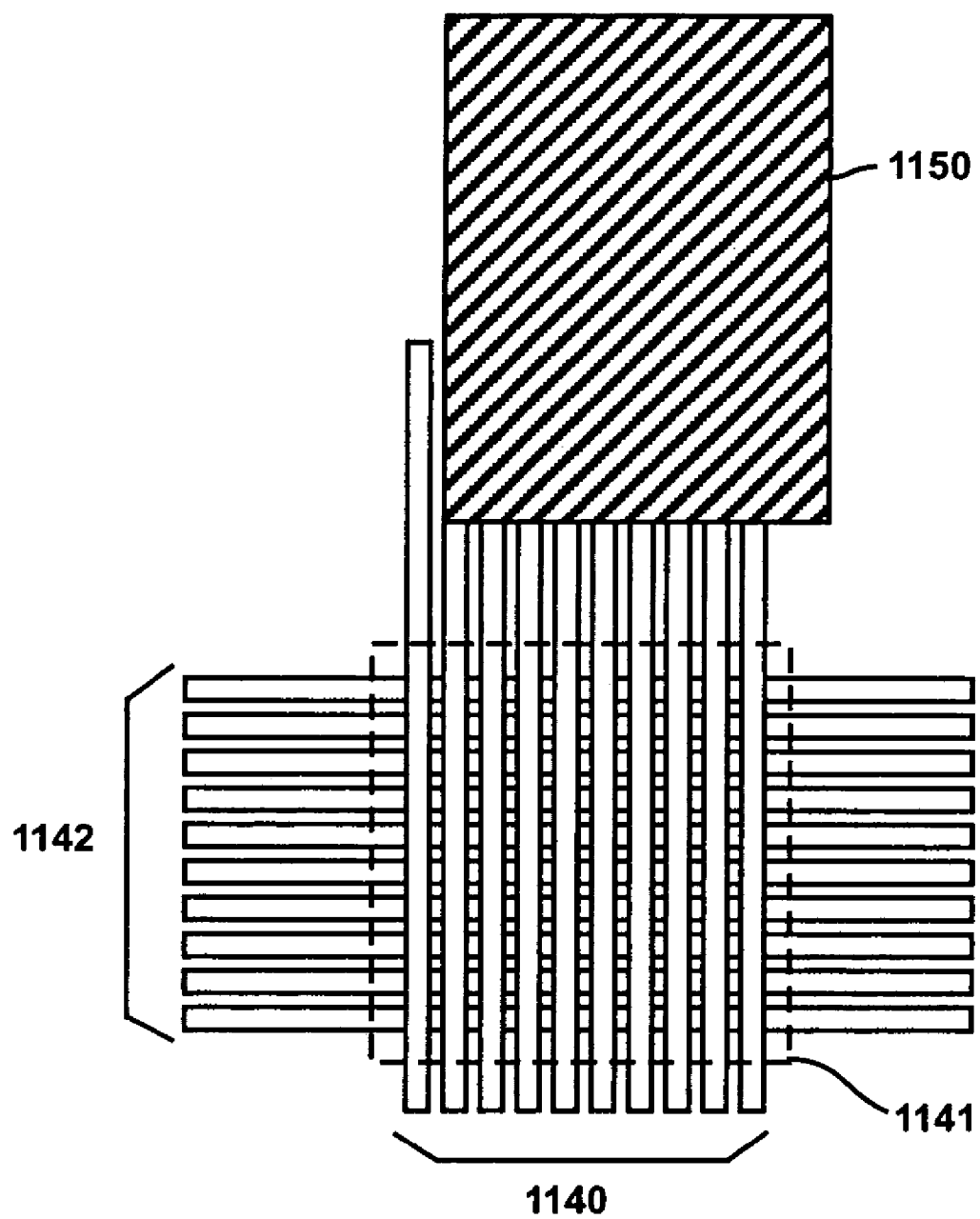
FIG. 22 depicts interconnection between a nanowire input and a microscale wire.

For inputs, the most straightforward way to interconnect the microscale line with the nanowires is to simply make a metal contact between a bundle of nanowires 1140 and a microscale metal wire 1150, as shown in FIG. 22. This allows the microscale wire 1150 to drive the nanowires 1140. The nanowires 1140 can then be programmed and used as diode inputs in the same manner as other nanowires. The programming voltages will be driven onto the microscale wire in order to program the diode junctions 1141 associated with nanowires 1140 and 1142.

Figure 24:
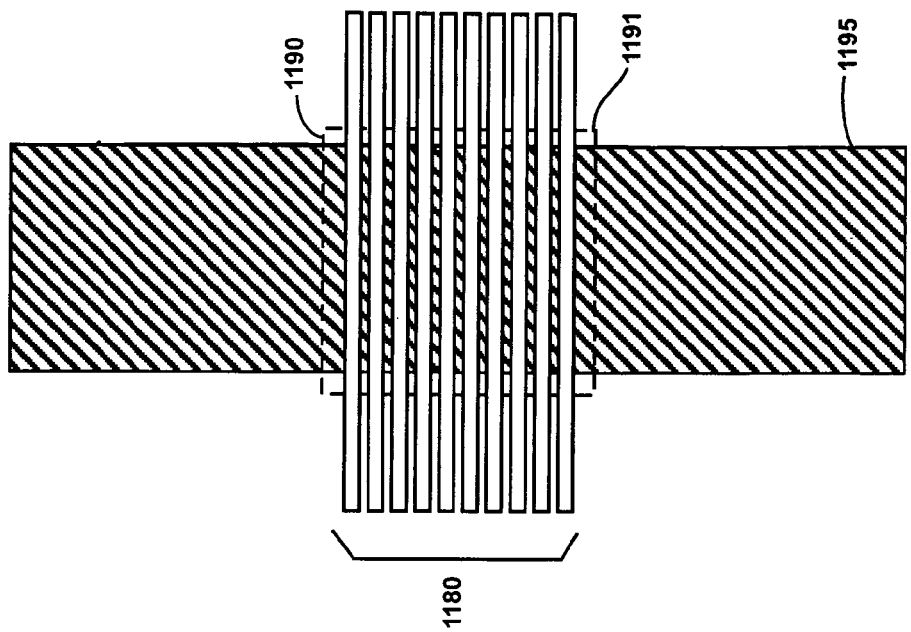
FIG. 24 depicts another exemplary interconnection between a nanowire output and a microscale wire.
Figure 23:
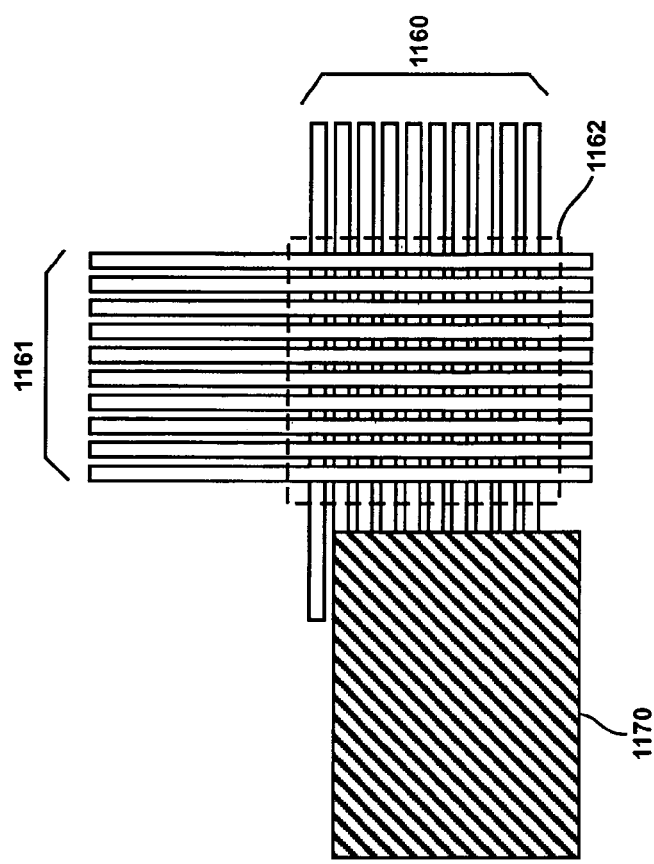
FIG. 23 depicts an exemplary interconnection between a nanowire output and a microscale wire.

For outputs, two options exist for interconnecting the microscale lines with the nanowires as shown in FIGS. 23 and 24. In the first option, shown in FIG. 23, a metal contact may be made between the nanowires 1160 and the microscale wire 1170. With this option, output of the nanoscale wire is driven with nanowires 1160, wherein the multiple nanowires 1160 serve to provide greater current to charging the device. An output voltage may be driven onto the nanowires 1161 in order to program the diode junctions 1162 associated with nanowires 1160 and 1161 and driven onto microscale wire 1170.

In the second option, shown in FIG. 24, a microscale wire 1195 may interconnect with the nanowires 1180 through a gate on a microscale FET 1190, wherein the multiple inputs may help turn-off the nanoscale device better than a single nanowire field alone. The microscale FET 1190 may contain oxide separation 1191.

The Following Fabrication Steps May be Used to Obtain PLA Cluster 1010 Described Above 1. Prepare individual nanowires—grow nanowires [See Y. Cui, L. J. Lauhon, M. S. Gudiksen, J. Wang, and C. M. Lieber in "Diameter-Controlled Synthesis of Single Crystal Silicon Nanowires" *Applied Physics Letters*, 78(15): 2214-2216, 2001 and A. M. Morales and C. M. Lieber in "A Laser Ablation Method for Synthesis of Crystalline Semiconductor Nanowires" *Science*, 279:208-211, 1998, which are incorporated herein by reference in their entirety] with axial differentiation [See S. Gudiksen, L. J. Lauhon, J. Wang, D. C. Smith, C. M. Lieber "Growth of Nanowire Superlattice Structures for Nanoscale Photonics and Electronics" *Nature*, 415:617-620, Feb. 7, 2002, which is incorporated herein by reference in its entirety] and radial differentiation [See L. J. Lauhon, M. S. Gudiksen, D. Wang, and C. M. Lieber "Epitaxial Core-Shell and Core-Multi-ShellNanowire Heterostructures" *Nature*, 420:57-61, 2002, which is incorporated herein by reference in its entirety]. A common radial differentiation is to place an oxide shell around the (semi-)conducting nanowire core.

2. Prepare a lithographic substrate with a flat surface.

Figure 25B:
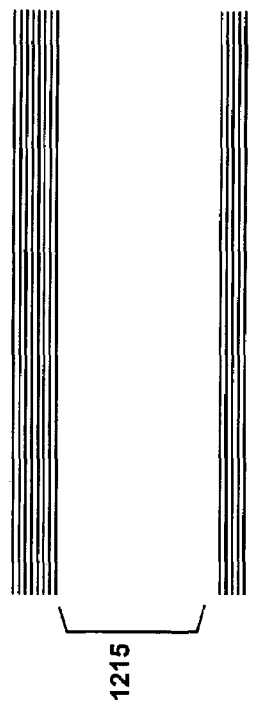
FIGS. 25A-25D depict fabrication steps to obtain a PLA cluster in FIG. 19.
Figure 25D:
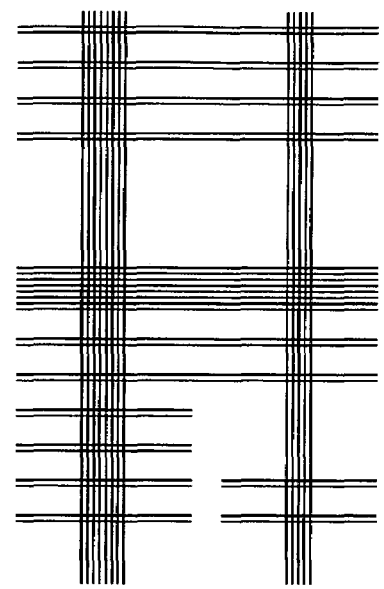
Figure 25A:
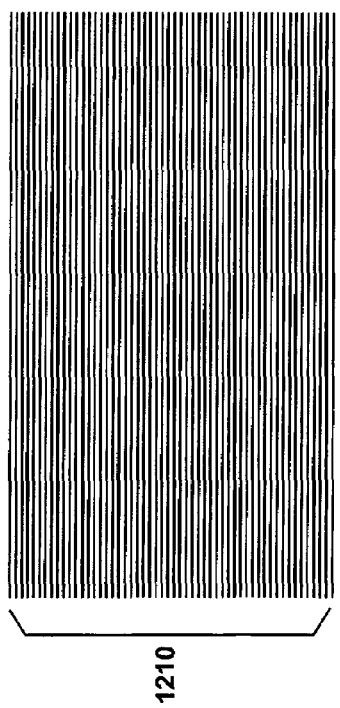

3. As shown in FIG. 25A, implement Langmuir-Blodgett techniques to align nanowires 1210 in a single direction, tight pack them, and transfer them to a surface (not shown) [See D. Whang, S. Jin, Y. Wu, and C. M. Lieber "Large-Scale Hierarchical Organization of Nanowire Arrays for Integrated Nanosystems" Nanoletters, 3(9): 1255-1259, September 2003, which is incorporated herein by reference in its entirety]. The oxide shell (not shown) defines the spacing between nanowire conductors.

4. Lithographically etch breaks 1215 in the nanowires 1210 to distinguish conduction regions, as shown in FIG. 25B.

5. Use directional or timed lithographic etches to remove the oxide coating (not shown) and expose the (semi-)conducting core of the nanowires where appropriate (e.g. contacts, some crosspoints) [See D. Whang, S. Jin, and C. M. Lieber "Nanolithography Using Hierarchically Assembled Nanowire Masks" *Nanoletters*, 3(7):951-954, Jul. 9, 2003, which is incorporated herein by reference in its entirety].

6. Lithographically mask and deposit metal coatings and anneal to convert desired portions of nanowires into metal silicide [See Y. Wu, J. Xiang, C. Yang, W. Lu, and C. M. Lieber "Single-Crystal Metallic Nanowires and Metal/Semiconductor Nanowire Heterostructures" *Nature*, 430: 61-64, Jul. 1, 2004, which is incorporated herein by reference in its entirety].

7. Use Langmuir-Bloldgett techniques to construct and transfer a uniform layer of molecules over the nanowire conductors, if appropriate [See C. L. Brown, U. Jonas, J. A. Preece, H. Ringsdorf, M. Seitz, and J. F. Stoddart "Introduction of [2] Catenanes into Langmuir Films and Langmuir-Blodgett Multilayers. A Possible Strategy for Molecular Information Storage Materials" *Langmuir,* 16(4):1924-1930, 2000, which is incorporated herein by reference in its entirety].

Figure 25C:
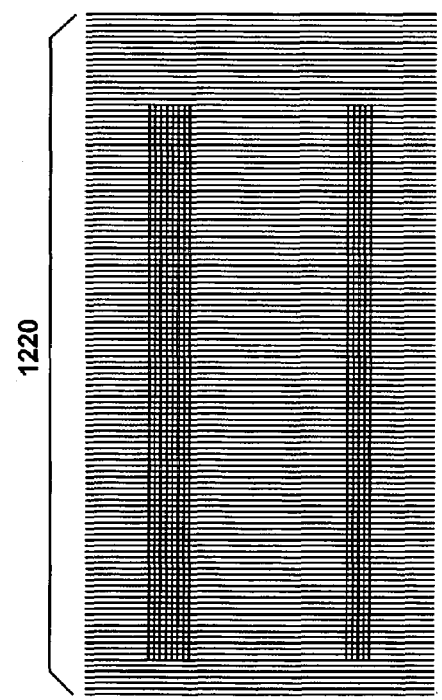

8. Repeat the Langmuir-Blodgett transfer of an orthogonal layer of nanowires to provide crossed nanowires 1220, as shown in FIG. 25C.

9. Repeat metal silicide conversion.

10. Repeat Lithographically defined etching to segment the orthogonal nanowire layer and expose their ends appropriately, as shown in FIG. 25D.

11. Add additional lithographic layers for contacts to obtain the structure as shown in FIG. 19.

As a result, tight pitch nanowires may be formed in both directions. Although it may be difficult to deterministically cut nanowires, define their lengths, or place contacts on nanowires below the lithographic resolution, it may be possible to differentiate the nanowires at nanowire pitch by defining features in the nanowires using timed growth when the nanowires are initially prepared [See A. DeHon, P. Lincoln, and J. Savage "Stochastic Assembly of Sublithographic Nanoscale Interfaces"; A. DeHon and M. J. Wilson "Nanowire-Based SublithogTaphic Programmable Logic AITays" In Proceedings of the *International Symposium on Field-Programmable Gate Arrays*, pages 123-132, February2004. ExtendedVersion: http://www.cs.caltech.edu/research/ic/abstracts/nanopla_fpga2004.html; and S. Gudiksen, L. J. Lauhon, J. Wang, D. C. Smith, C. M. Lieber "Growth of Nanowire Superlattice Structures for Nanoscale Photonics and Electronics" *Nature*, 415:617-620, Feb. 7, 2002, which are incorporated herein by reference in their entirety]. As a result, regular architectures that use a large number of parallel nanowires may be implemented, wherein the length and the width of the nanowires is of lithographic scale.

Some of the nanoscale wires assembled into the PLA according to the present disclosure may be broken.

Therefore, useful preliminary operations will include discovery of:

1. which nanoscale wire addresses are present in the array;
2. which nanoscale wires are non-broken;

3. which nanoscale wire addresses are restored in a non-inverting sense;
4. which nanoscale wire addresses are restored in an inverting sense;

As a further step, the programming of the nanoPLA will be adapted around the manufacturing characteristics individuated in accordance with the previous steps.

The person skilled in the art will note that the structure of the sublithographic PLA according to the present disclosure is advantageous, because the PLA can be probed from the microscale lines and the microscale lines can be used to configure the functional portions of the PLA to implement a dfined logic function.

Figure 26:
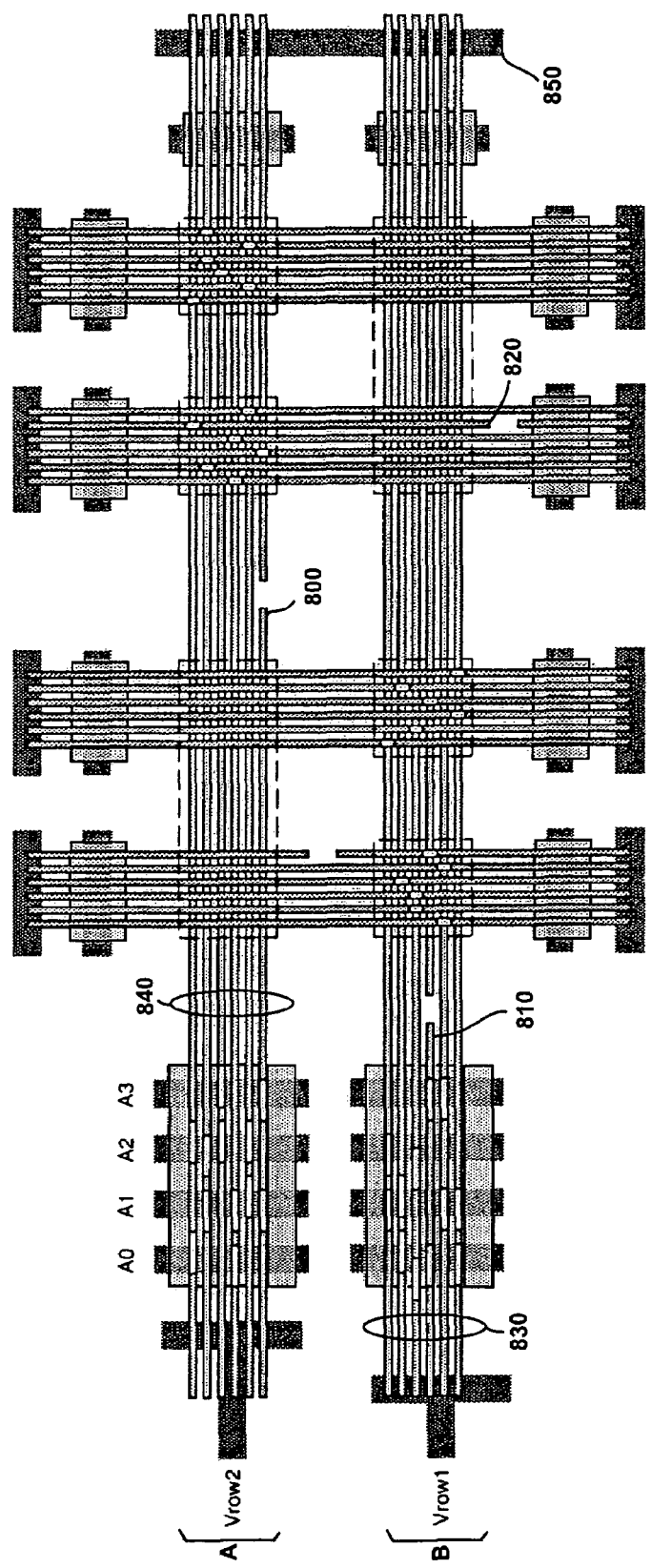
FIG. 26 depicts programming of the PLA to perform a 2-input XOR.

The following example illustrates programming of the PLA in FIG. 26 to perform a 2-input XOR. To better illustrate defect handling, three nanoscale wires 800, 810 and 820 are broken as depicted in FIG. 26.

A first step is that of discovering which addresses are present in each of the two planes A and B. Since 4 address lines $A_0 \ldots A_3$ are present for addressing the nanoscale wires 830 and 840, by using a 2-hot code, 6 possible addresses (1100, 1010, 0110, 1001, 0101, 0011) for the OR-terms in each plane need to be tested.

The following steps will be performed to test for the presence of the 6 possible addresses:
1. Drive ohmic contact 850 to ground, then release it.
2. Drive the address lines ($A_0, A_1, \ldots A_3$) to the test address.
3. Drive the common row line Vrow1 or Vrow2 to high.
4. Observe the voltage on the ohmic contact 850.

The ohmic contact 850 will be raised to high only if the test address is present allowing a complete path between Vrow1 or Vrow2 and ohmic contact 850.

Figure 27:
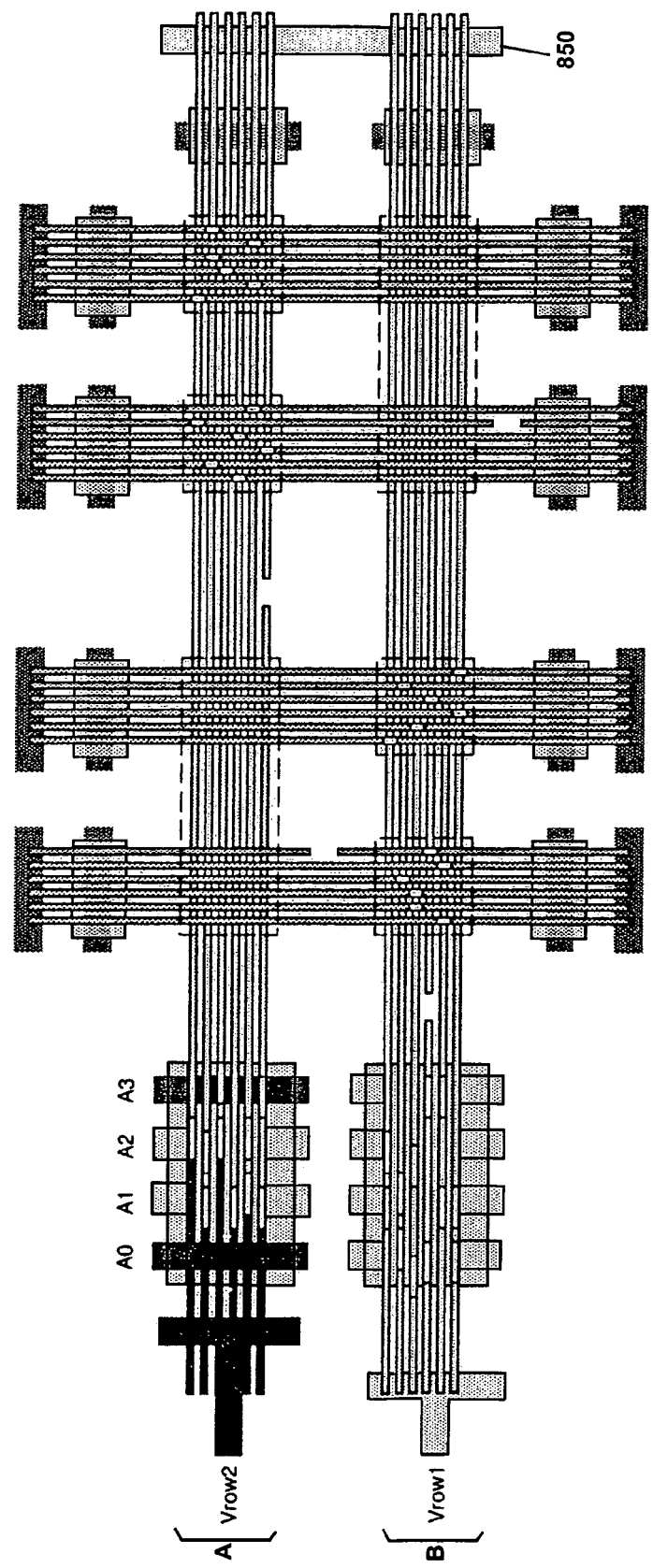
FIG. 27 depicts reading of the address 1001.
Figure 28:
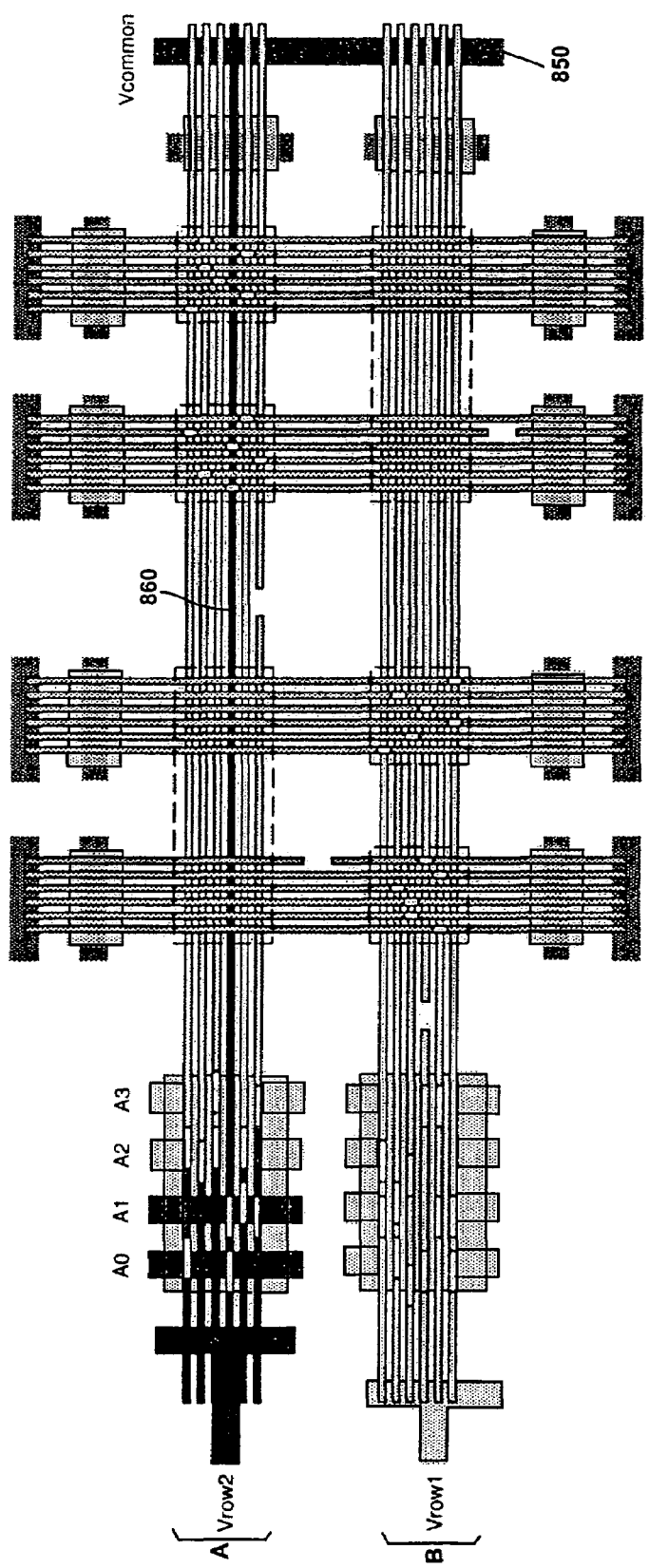
FIG. 28 depicts reading of the address 1100.
Figure 29:
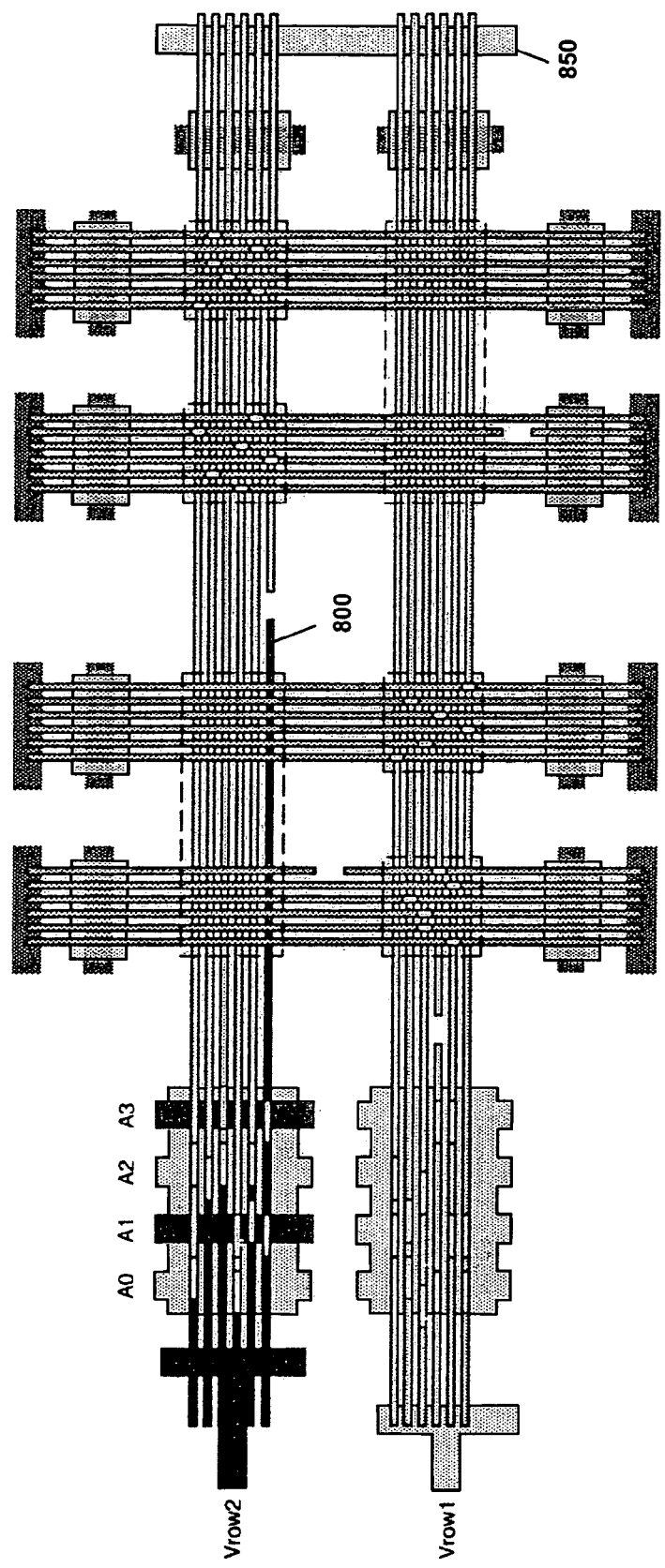
FIG. 29 depicts reading of the address 0101.

FIG. 27 depicts an attempt to read the address 1001 on the plane A. Since the nanoscale wire under address 1001 is not present, this results in no current path from Vrow2 to ohmic contact 850 and ohmic contact 850 remains low. FIG. 28 depicts an attempt to read the address 1100 on the plane A. Since the nanoscale wire 860 has the address 1100 and it is unbroken, this does succeed in raising the voltage on ohmic contact 850. FIG. 29 depicts an attempt to read address 0101 which does not raise ohmic contact 850 since the nanoscale wire 800 has a break in it. After testing all six addresses, the present and functional addresses in the plane A are 1100, 1010, 0110, and 0011. Similar testing for the plane B turns out that the present and functional addresses are 1100, 1010, 0110, and 0101.

Figure 30:
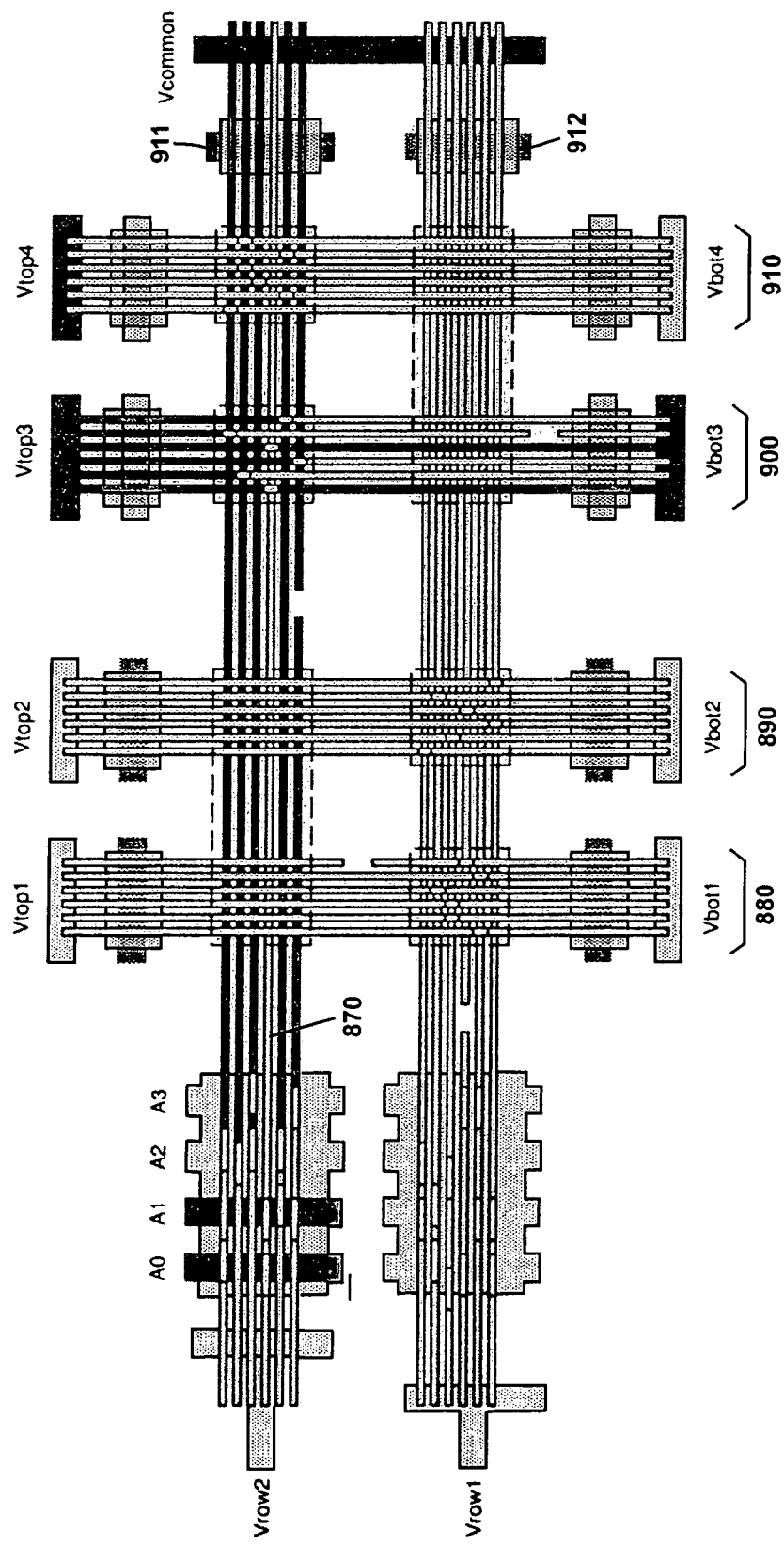
FIG. 30 depicts determining the proper restoration of the signal for a good address.

By knowing which addresses are present, it is possible determine which polarities they provide. Referring to FIG. 30, to determine if the output is restored, each good address is driven to a low voltage, while other nanoscale wires are driven high.

The following steps are performed for each good address:
1. Setting the gate-side supplies on the restoration column (Vtop1 . . . Vtop4) to a low voltage.
2. Driving the opposite supplies (Vbot1 . . . Vbot4) to a low voltage and release.
3. Using Vcommon, Vrow1 and Vrow2 to precharge all lines to a high voltage, that is drive the precharge devices 911, 912 and all of the addresses $A_0 \ldots A_3$ to high. This allows charging up all of the nanowires to the high voltage, even nanoscale wires with a single break are charged to a high voltage.
4. Releasing Vcommon, Vrow1 and Vrow2 and return the addresses to zeros.
5. Driving the intended address on the address lines.
6. Driving Vrow1 and Vrow2 to a low voltage.
7. After the row line has had time to discharge, driving the gate-side supplies on the appropriate restoration columns (Vtop1 . . . Vtop4) to a high voltage.
8. Observing the voltage on the opposite supply (Vbot1 . . . Vbot4) once the restoration line has had a chance to charge.

Since the restoration nanoscale wires can be p-type nanoscale wires, a high voltage across their lightly-doped control region will deplete carries and prevent conduction, while a low voltage will allow conduction. In steps 3-6, only the addressed row is low; all other rows are driven to a high value. As a result, conduction will be seen between Vtop and Vbot in a column if the addressed nanoscale wire controls some nanoscale wire in that column.

FIG. 30 depicts the testing of the nanoscale wire 870 under the address 1100. As described above, nanoscale wire 870 under the address 1100 is driven to a low voltage. The restoration columns for this nanoscale wire 870 are bracketed by Vtop3/Vbot3 and Vtop4/Vbot4, so Vtop3 and Vtop4 are driven to high voltages and the voltage on Vbot3 and Vbot4 are observed. Since the nanoscale wire 870 intersects with two control regions in restoration column 900 and no control regions in restoration column 910, Vbot3 is pulled high while Vbot4 remains low. If restoration column 900 set up as the inverting column, the fact that Vbot3 is pulled high shows that the address 1100 OR term can only be used in its inverting sense.

Figure 31:
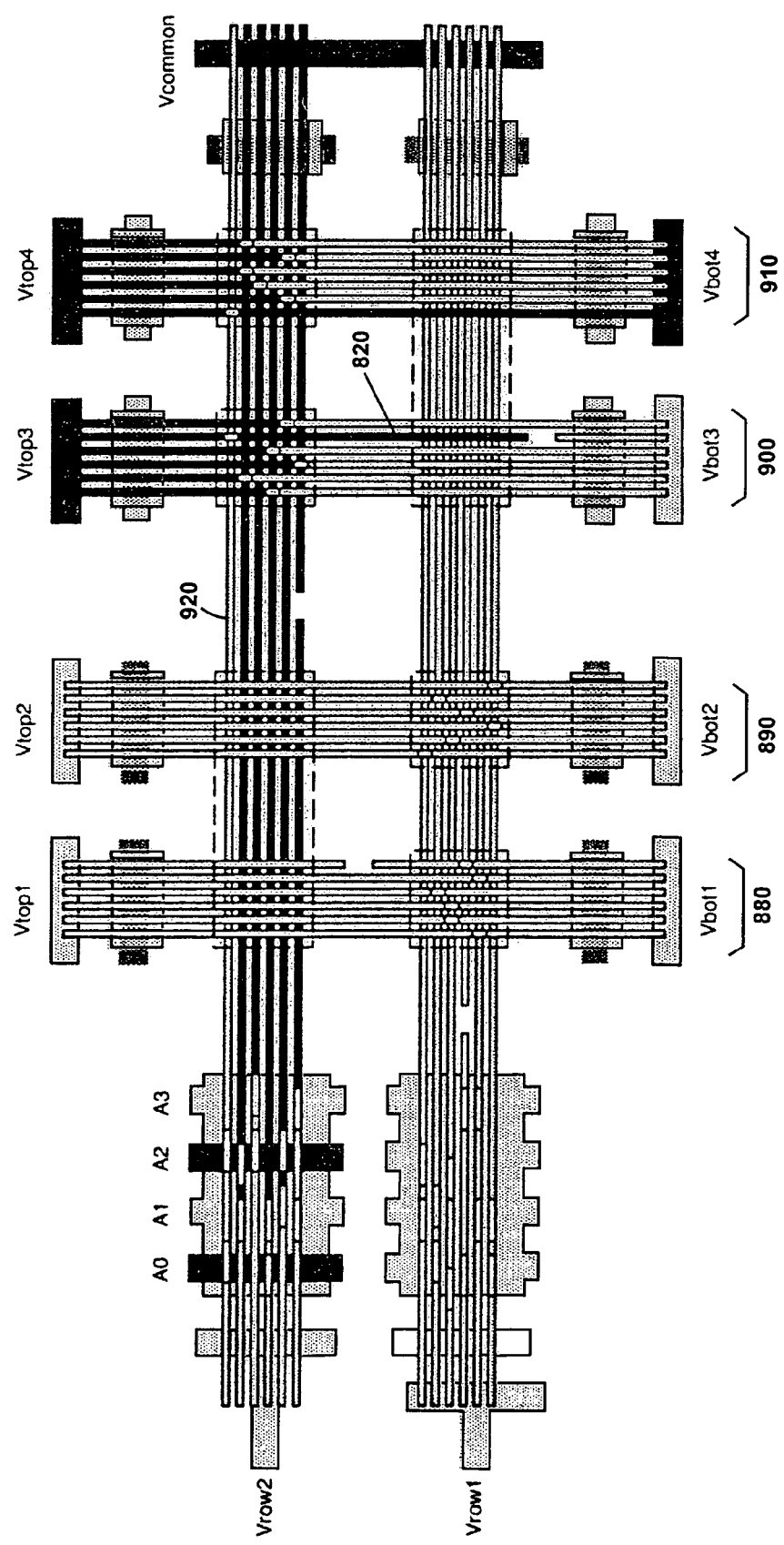
FIG. 31 depicts testing address 1010.

FIG. 31 depicts testing of the nanoscale wire 920 under the address 1010. The nanoscale wire 920 controls restoration wires in both columns 900 and 910. However, the restoration nanoscale wire 820 in column 900 is broken. Consequently only the restoration in column 910 is usable. Vbot4 is pulled high, but Vbot3 remains low because of the broken nanoscale wire 820. This shows that the address 1010 or term can only be used in its non-inverting sense.

Figure 32:
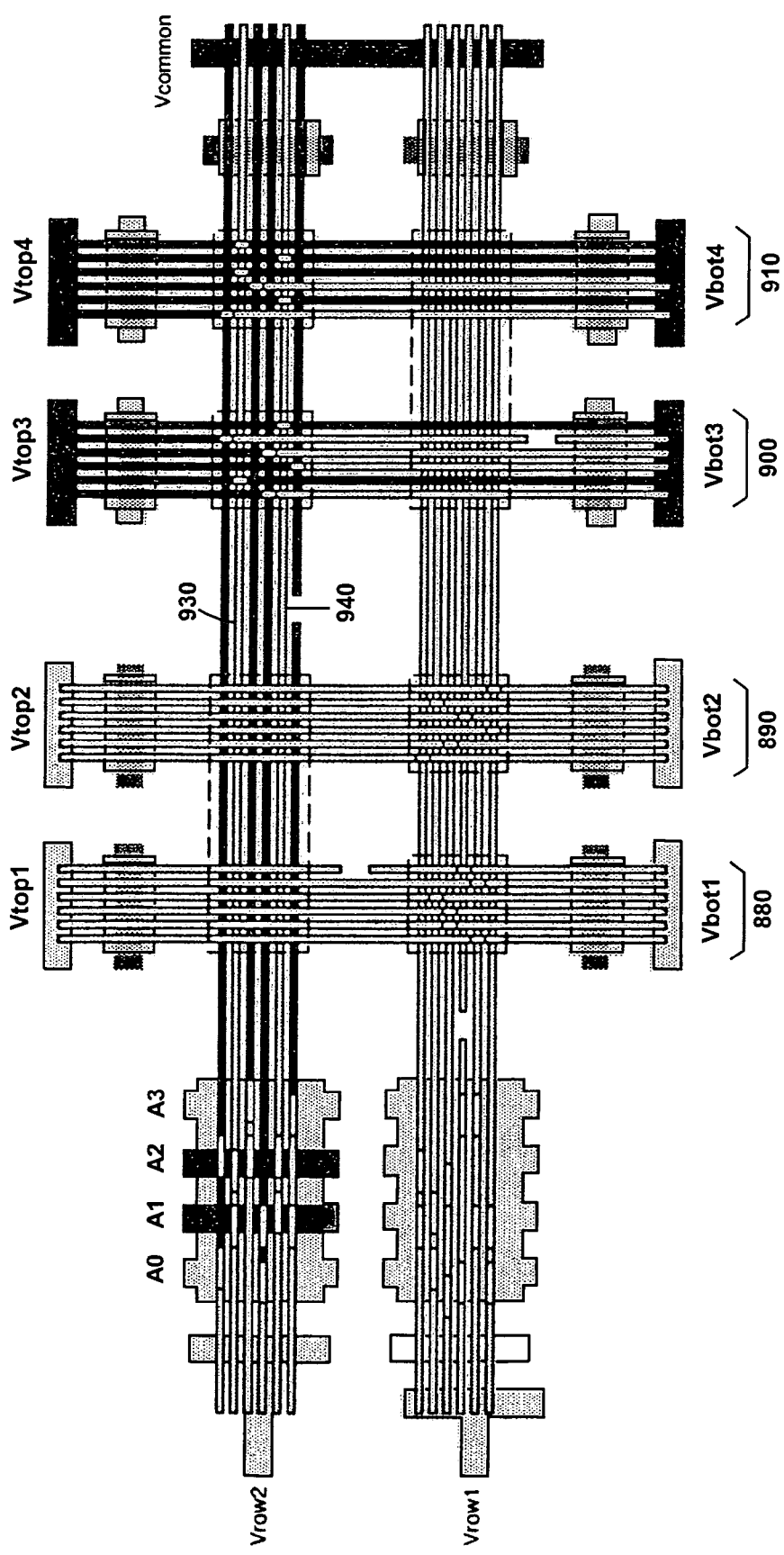
FIG. 32 depicts testing of the address 0110.

FIG. 32 depicts testing of the nanoscale wires under the address 0110. As depicted, there are two nanoscale wires 930 and 940 that are addressed by 0110. So by using address 0110 both nanoscale wires 930 and 940 are affected. By setting nanoscale wires 930 and 940 low, it turns out that there are multiple nanoscale wires in columns 900 and 910 affected by the address 0110 or terms. Both Vbot3 and Vbot4 are driven high showing that both polarities of the 0110 OR-term are available, i.e. the term is binate.

Similar tests can be performed on the plane B. In this case, the outputs of this or plane are restored by columns 880 and 890. High test values are driven into Vbot1 and Vbot2 and the voltages at Vtop1 and Vtop2 are observed; the role of top and bottom supplies are reversed compared to the plane A to match the fact that the position of the restoration array and the succeeding OR array are reversed. After performing the test, it is determined that the addresses 1100 and 1010 are binate, 0110 is non-inverting, and 0101 is inverting.

Figure 33:
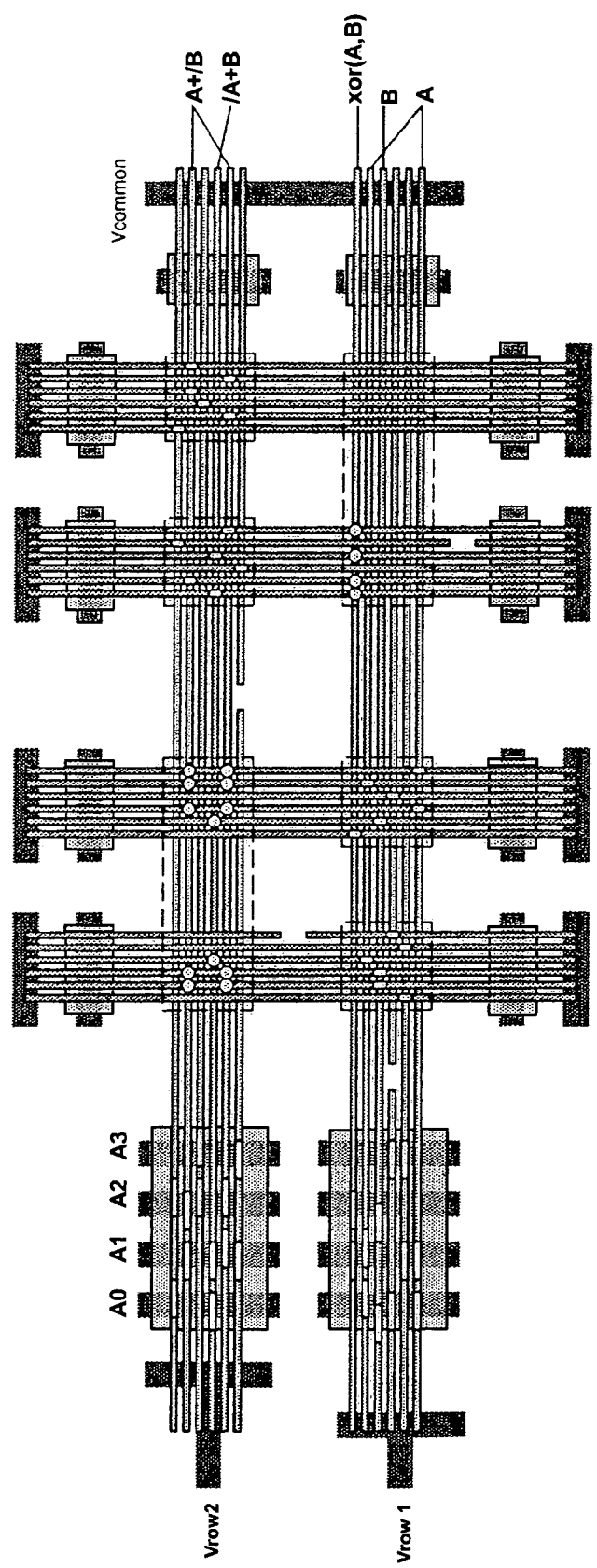
FIG. 33 depicts an assignment of known good OR terms to the XOR calculation.

By knowing which polarities are available from each of the present addresses, it is possible to program the intended function. FIG. 33 depicts an assignment of known, good OR terms to the XOR calculation. The inputs A and B on the bottom or terms 1100 and 1010 are brought in. Both polarities of A and B are needed, and both of the terms 1100 and 1010 are binate. The $\overline{A}+B$ is computed on the top or term 1100 since it is inverting, the $A+\overline{B}$ is computed on the top or term 0110 which is binate so it can provide an inverted output. Finally, bottom or term 0110 is used to OR together $\overline{A+B}$ and $\overline{A+\overline{B}}$ to produce the XOR of A and B.

Figure 34:
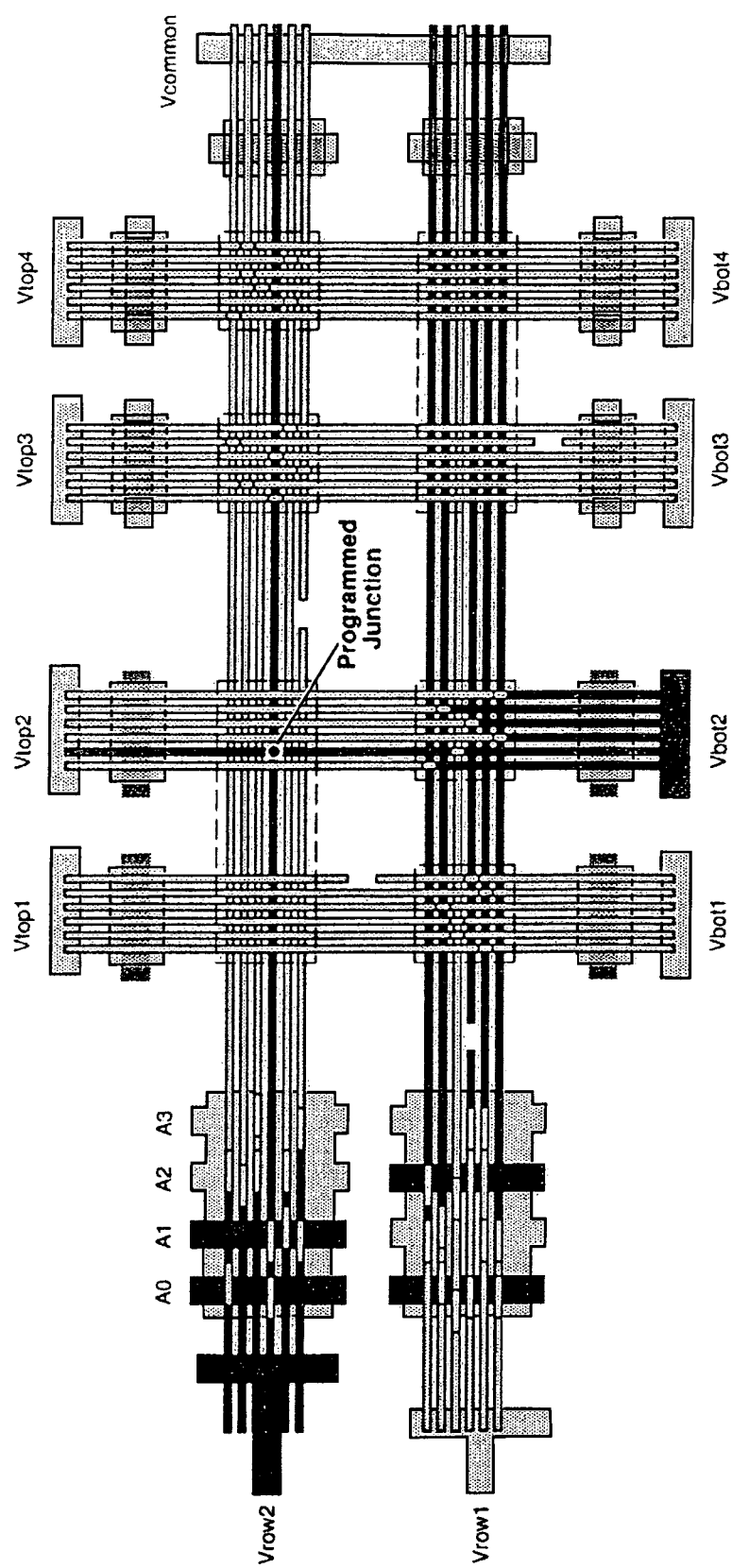
FIG. 34 depicts restoring signal B as an input to the $\overline{A+B}$ in the top plane.

To program up each crosspoint, suitable voltages must be applied to both the nanoscale wires in the junction. For example, to make the restored B an input to the $\overline{A}+B$ in the top plane, the low addresses are set to 1010 to select B's OR term and the high address to 1100 to select the $\overline{A}+B$ OR nanoscale wire, as depicted in FIG. 34. Similar to polarity testing above, the plane B nanoscale wires are precharged to high and then Vrow1 is driven to low so that only the 1010 address is low and enables conduction to the OR plane. Vrow2 is driven directly to the low voltage needed for junction programming. Vbot2 is driven to the high voltage needed for junction programming, and Vbot1 is left at a nominal voltage so that the non-inverting B input is programmed. The Vtop3, Vtop4, Vbot3, Vbot4 are kept at nominal voltages so that junctions in the bottom-right or plane B are not programmed while the intended junction in the top-left or plane A is being programmed.

Figure 35:
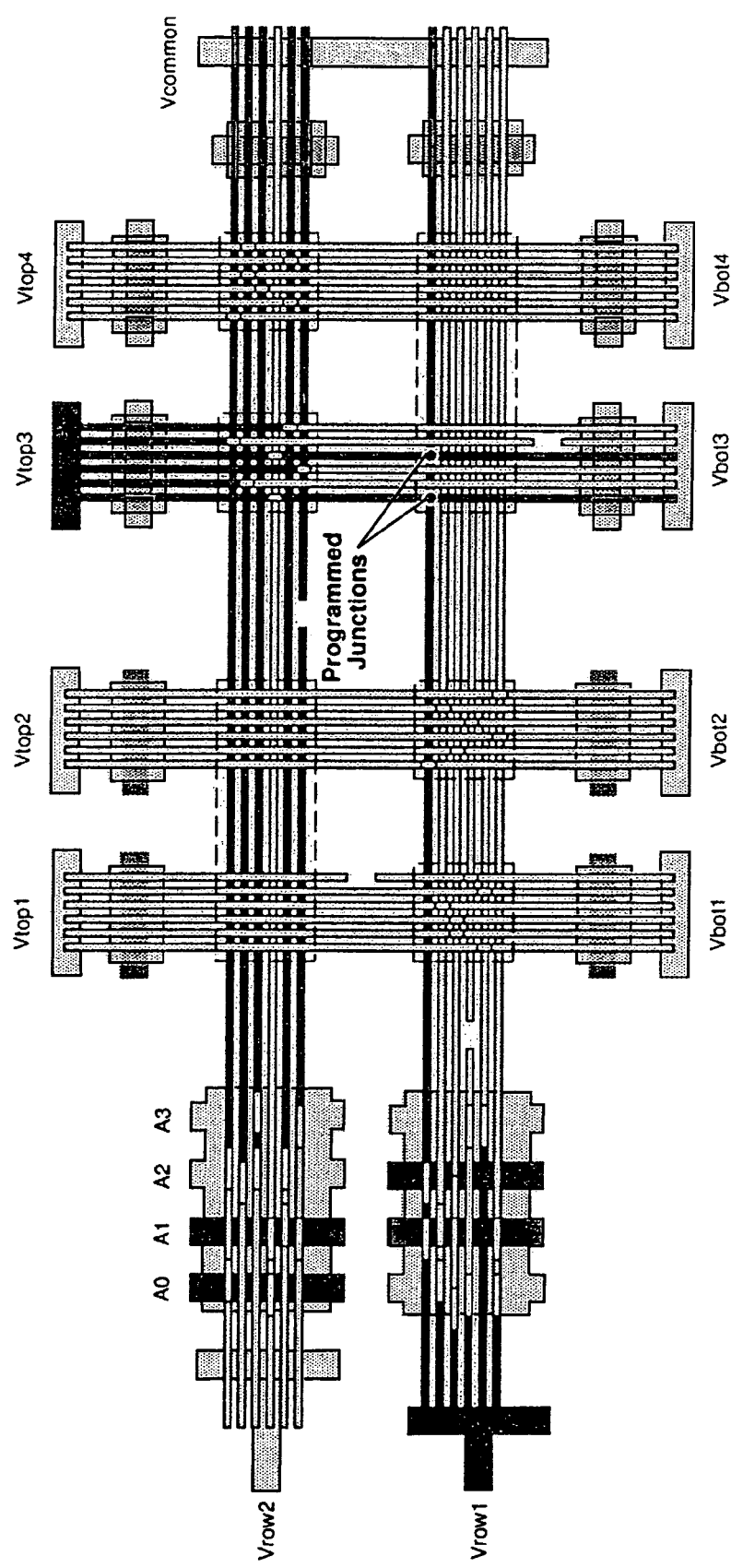
FIG. 35 depicts programming of the $\overline{A+B}$ XOR junction.

To program a junction in the bottom-right or plane, the programming voltages on Vtop3 or Vtop4 are driven while voltages on Vbot1 and Vbot2 are keept at nominal voltages. For example, in FIG. 35 depicts programing of the $\overline{A}+B$ to XOR junction. Here Vtop3 is placed at the high programming voltage since connection is inverting, and Vtop4 is held at a nominal voltage along with Vbot1 and Vbot2.

Logic Mapping

The following process may be used to implement arbitrary logic at nanoscale.

1) Start with one or more of:
   a) logic equations in a standard CAD format (e.g. EQN)
   b) finite-state machine description in a standard CAD format (e.g. KISS2)
   c) a netlist of simple logic gates and registers in a standard CAD format (e.g. BLIF)

One skilled in the art will recognize there are many other formats that can be used (including freely converted to these exemplary formats). Further, one skilled in the art will know how to convert RTL designs in popular CAD languages (e.g. VHDL, Verilog) to logic in these forms.

2) Perform standard, technology independent logic optimization. SIS is a widely used, freely licensed, tool from Berkeley that can perform this optimization. See E. M. Sentovich, K. J. Singh, L. Lavagno, C. Moon, R. Murgai, A. Saldanha, H. Savoj, P. R. Stephan, R. K. Brayton, and A. Sangiovanni-Vincentelli. SIS: A System for Sequential Circuit Synthesis. UCB/ERL M92/41, University of California, Berkeley, May 1992, which is incorporated herein by reference in its entirety. However, one skilled in the art will be familiar with other tools that can also be used in place of SIS.

3) Decompose the logic and cover into PLA clusters of specified size. Techniques are described in: D. Chen, J. Cong, M. Ercegovac, and Z. Huang "Performance-Driven Mapping for CPLD Architectures" IEEE Transactions on Computed-Aided Design for Integrated Circuits and Systems, 22(10):1424-1431, October 2003, which is incorporated herein by reference in its entirety. UCLA also provides a free tool suite that implements these techniques: J. Cong, D. Chen, E. Ding, Z. Huang, Y.-Y. Hwang, J. Peck, C. Wu, and S. Xu. RASP SYN release B 2.1: FPGA/CPLD Technology Mapping and Synthesis Package. <http:/ballade.cs.ucla.edu/software release/rasp/htdocs/>, 2004.

It may be necessary to pick the parameters to PLAMAP to map to the size of the physical nanoPLA clusters one builds. How the (I,P,O) parameters of PLAMAP are related to physical parameters of the PLA clusters is discussed in more detail below.

4) Place the logical PLA clusters onto the physical 2D grid of PLA clusters. One skilled in the art will be familiar with suitable techniques for placement. For example, a VPR tool from Toronto is a specific, freely licensed tool, which can perform this task. V. Betz. VPR and T-VPack: Versatile Packing, Placement and Routing for FPGAs. <http://www.eecg.toronto.edu/~vaughn/vpr/vpr.html>, Mar. 27, 1999. See also version 4.30. V. Betz and J. Rose. VPR: "A New Packing, Placement, and Routing Tool for FPGA Research" In W. Luk, P. Y. K. Cheung, and M. Glesner, editors, Proceedings of the International Conference on Field-Programmable Logic and Applications, number 1304 in LNCS, pages 213-222. Springer, August 1997, which is incorporated herein by reference in its entirety.

5) Route signals between placed PLA clusters, routing through intermediate PLAs as necessary. One skilled in the art may adapt the Pathfinder routing algorithm to perform this routing task. L. McMurchie and C. Ebling. PathFinder: "A Negotiation-Based Performance-Driven Router for FPGAs" In Proceedings of the International Symposium on Field-Programmable Gate Arrays, pages 111-117. ACM, February 1995, which is incorporated herein by reference in its entirety.

The above steps 1-5 may be performed once per design.

6) Identify defective wires and avoid them as described above.

7) Assign logical or-terms to physical nanowires. This can be performed as a matching algorithm as detailed in: H. Naeimi and A. DeHon "A Greedy Algorithm for Tolerating Defective Crosspoints in NanoPLA Design" In Proceedings of the International Conference on Field-Programmable Technology, pages 49-56. IEEE, December 2004, which is incorporated herein by reference in its entirety.

The above steps 6, 7 may be performed for each device. To accommodate the above steps 6 and 7, the number of physical wires in the array (Pir, Por, Or, Wsegr, discussed below) and the mapping parameters (I, P, O . . . and Imax, Pmax described below) are selected based on the expected fault rate. See Andre' DeHon and Helia Naeimi "Seven Strategies for Tolerating Highly Defective Fabrication" IEEE Design and Test of Computers, vol 22, no. 4, 2005, which is incorporated herein by reference in its entirety.

Parameters

Figure 36:
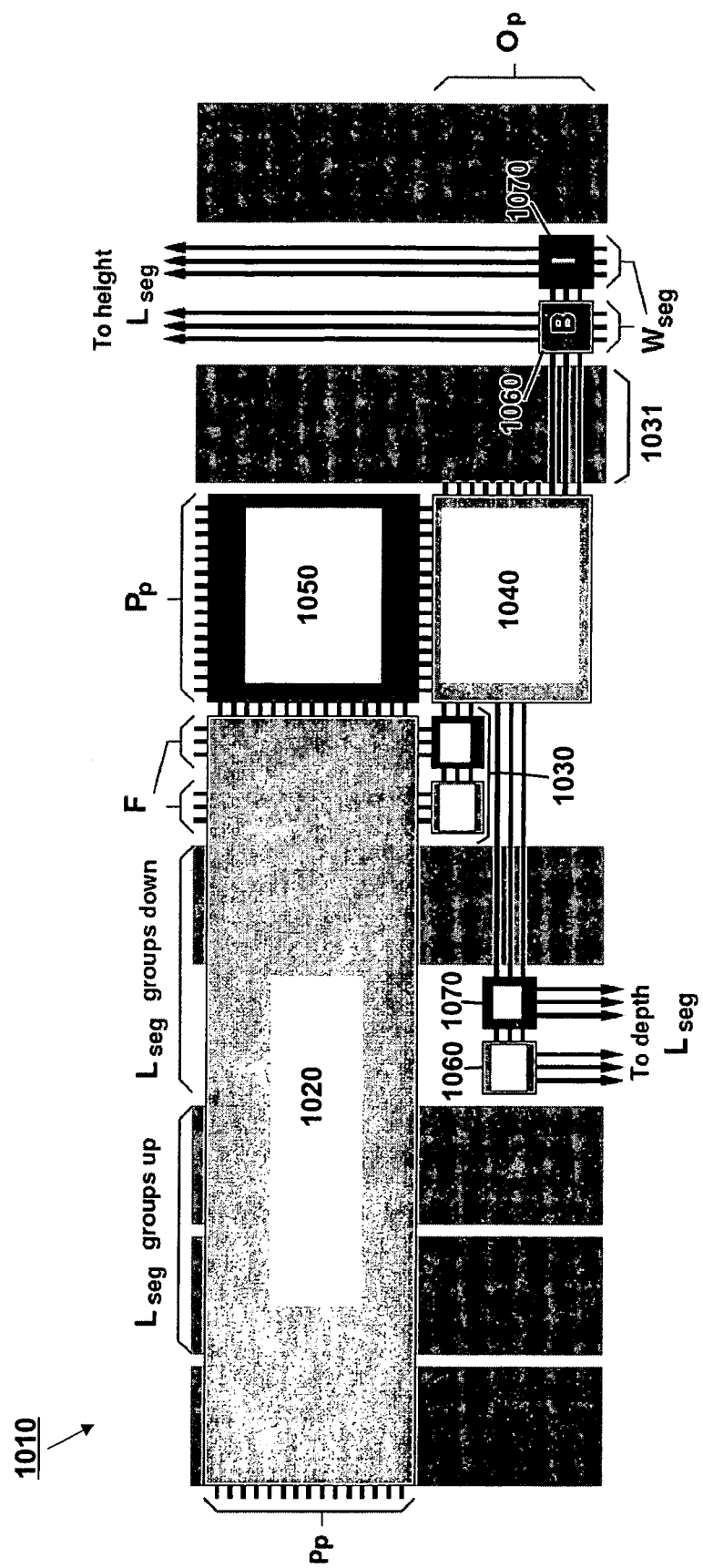
FIG. 36 depicts key parameters in the design of the PLA clusters in FIG. 18.

FIG. 36 shows the key parameters in the design of the PLA clusters 1010.

$W_{seg}$—number of nanowires in each output group $L_{seg}$—number of nanoPLA block heights up or down which each output crosses;

equivalently, the number of parallel wire groups across each Y route channel 1180 in each direction. For exemplary purposes $L_{seg}=2$.

F—number of nanowires in feedback signals 1030; for simplicity $F=W_{seg}$.

P—number of logical PTERMS in the wired logic region 1020.

Op—number of physical outputs in the OR plane 1040. Since each output is driven by a separate wired-OR nano wire, $Op=2\times W_{seg}+F$.

Pp—number of physical PTERMS in the wired logic region 1020. Since these are also used for route-through connections, this is larger than the number of logical PTERMS in each logic block.

$$P_p \leq P + 2 \times W_{seg} + F$$

That is, in addition to the P logical PTERMS, there may be a need for one physical wire for each signal that routes through the array for buffering; there will be at most $O_p$ of wires.

$P_{or}$, $P_{ir}$, $O_r$ and $W_{segr}$ are the raw number of wires needed to populate in the PLA array in order to yield $P_p$ restored inputs, $O_p$ restored outputs, and $W_{seg}$ routing channels.

Additionally, the number and distribution of inputs could be parameterized (e.g. one side (as shown), from both sides (not shown), subsets of PTERMS from each side (not shown)), the output topology (e.g. route both up and down on each side of the array of PLA clusters 1000), and segment length distributions.

Design Automation

Figure 37:
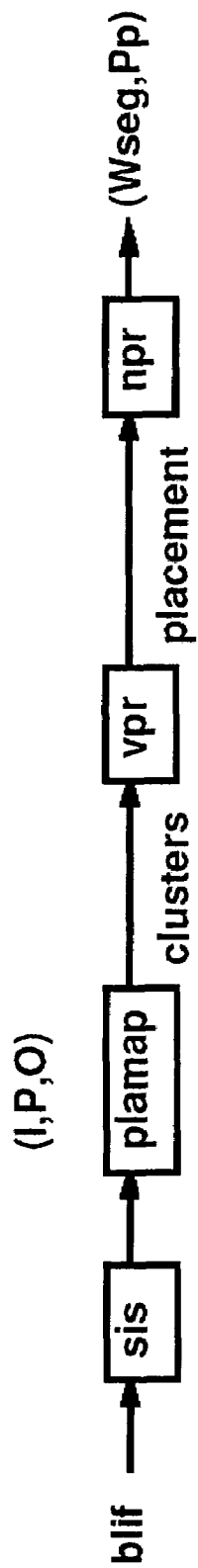
FIG. 37 depicts a combination of conventional and custom tools that may be used to map from standard logic net lists to the PLA arrays in FIG. 18.

To map from standard logic net lists (e.g. BLIF) to the PLA arrays 1000, a combination of conventional and custom tools may be used as shown in FIG. 37. As stated above, SIS performs standard, technology independent optimizations and decomposes the logic into small fanin nodes for covering. For example, PLAMAP can take in a netlist of primitive logic gates and cover the logic while assuring that each logic PLA cluster does not exceed architectural limitations, including:

I—number of inputs to a PLA cluster
P—number of Product Terms in each PLA cluster
O—number of outputs to PLA cluster
$P_{max}$—the maximum number of product terms which fan in to any OR-term
$I_{max}$—the maximum number of inputs which fan in to any particular AND-term These clusters can then be placed with VPR. While VPR. Can also route designs, the routing architecture for the PLA array is sufficiently different to merit separate treatment. Consequently, nanoPLA router (npr) has been developed for routing. Along with a route, npr returns the key physical design parameters $W_{seg}$ ad $P_p$ discussed above.

The cluster mapping variables to PLAMAP (I,P,O) only account for the logical mapping. I and O impact $W_{seg}$; routing along with P impacts $P_p$.

NanoPLA Router (npr)

The nanoPLA router is a global, directional wire router using Pathfinder-like history. Since the nanoPLA inputs are effectively a fully populated crossbar, there are no detail routing limitation; inputs can be switched in from just about any channel upon which they arrive. Similarly, outputs can be placed on any wire channel by programming the output channel's wired OR appropriately in the OR plane of the PLA block. The route search proceeds through each nanoPLA logic block it encounters, accounting for the extra PTERMS required for such route-through logic so that $P_p$ is measured and minimized.

In summary, an apparatus and methods for interconnecting a plurality of nanoscale programmable logic array (PLA) clusters are disclosed. The appartus allows PLA clusters to be built at nanoscale dimensions, signal restoration to occur at the nanoscale, and interconnection between PLA clusters to be performed with nanoscale wiring. The nanoscale PLA, restoration, and interconnect arrangements can be constructed without using lithographic patterning to produce the nanoscale feature sizes and wire pitches. The nanoscale interconnection of the plurality of nanoscale PLA clusters can implement any logic function or any finite state machine. The nanoscale interconnect allows Manhattan (X,Y grid) routing between arbitrary nanoscale PLA clusters. The methods teach how to interconnect nanoscale PLAs with nanoscale interconnect and how to build arbitrary logic with nanoscale feature sizes without using lithography to pattern the nanoscale features.

While several illustrative embodiments of the invention have been shown and described, numerous variations and alternative embodiments will occur to those skilled in the art. Such variations and alternative embodiments are contemplated, and can be made without departing from the scope of the invention as defined in the appended claims.

What is claimed is:

1. An array of programmable logic array (PLA) clusters each cluster comprising:
    a first plurality of nanoscale wires forming a first wired logic;
    a first restoring inverting arrangement connected with the first wired logic, the first restoring inverting arrangement comprising a second plurality of nanoscale wires crossing the first plurality of nanoscale wires, the first restoring inverting arrangement restoring and inverting signals of the first wired logic; and
    a third plurality of nanoscale wires crossing the second plurality of nanoscale wires and forming a second wired logic,
    wherein an output of at least one PLA cluster forms an input of at least one other PLA cluster.

2. The array of PLA clusters of claim 1, wherein the first wired logic is either a wired-OR logic or a wired-AND logic.

3. The array of PLA clusters of claim 1, wherein the second wired logic is a wired-OR logic.

4. The array of PLA clusters of claim 1, wherein each PLA cluster further comprises a first restoring non-inverting arrangement connected with the first wired logic, the first restoring non-inverting arrangement comprising another plurality of nanoscale wires crossing the first plurality of nanoscale wires, the first restoring non-inverting arrangement restoring signals of the first wired logic.

5. The array of PLA clusters of claim 1, wherein each PLA cluster further comprises a first set of programmable ON-OFF devices associated with crossings between the second plurality of nanoscale wires and the third plurality of nanoscale wires.

6. The array of PLA clusters of claim 5, wherein the programmable ON-OFF devices are diodes.

7. The array of PLA clusters of claim 1, wherein each PLA cluster further comprises a fourth plurality of nanoscale wires acting as feedback signals in the PLA cluster.

8. The array of PLA clusters of claim 7, wherein the fourth plurality of nanoscale wires crosses the first plurality of nanoscale wires and the third plurality of nanoscale wires.

9. The array of PLA clusters of claim 8, wherein the fourth plurality of nanoscale wires comprises a second restoring inverting arrangement for restoring and inverting signals on the third plurality of nanoscale wires.

10. The array of PLA clusters of claim 8, wherein the fourth plurality of nanoscale wires comprises a first restoring non-inverting arrangement for restoring signals on the third plurality of nanoscale wires.

11. The array of PLA clusters of claim 8, wherein each PLA cluster further comprises a second set of programmable ON-OFF devices associated with crossings between the first plurality of nanoscale wires and the fourth plurality of nanoscale wires.

12. The array of PLA clusters of claim 11, wherein the programmable ON-OFF devices are diodes.

13. The array of PLA clusters of claim 1, wherein at least one PLA cluster comprises a fifth plurality of nanoscale wires for connecting the first wired logic of one of the PLA cluster with the third plurality of nanoscale wires of the at least one PLA cluster.

14. The array of PLA clusters of claim 1, wherein at least one PLA cluster comprises a fifth plurality of nanoscale wires for connecting the first wired logic of the at least one PLA cluster with the third plurality of nanoscale wires of another PLA cluster.

15. The array of PLA clusters of claim 13, wherein the fifth plurality of nanoscale wires contains a third restoring inverting arrangement for restoring and inverting signals on the third plurality of nanoscale wires of the at least one PLA cluster.

16. The array of PLA clusters of claim 14, wherein the fifth plurality of nanoscale wires contains a third restoring inverting arrangement for restoring and inverting signals on the third plurality of nanoscale wires of the another PLA cluster.

17. The array of PLA clusters of claim 13, wherein the fifth plurality of nanoscale wires contains a second restoring non-inverting arrangement for restoring signals on the third plurality of nanoscale wires of the at least one PLA cluster.

18. The array of PLA clusters of claim 14, wherein the fifth plurality of nanoscale wires contains a second restoring non-inverting arrangement for restoring signals on the third plurality of nanoscale wires of the another PLA cluster.

19. The array of PLA clusters of claim 1, wherein the array of PLA clusters further comprises a fifth plurality of nanoscale wires, wherein the fifth plurality of nanoscale wires of one of the PLA cluster crosses the first plurality of nanoscale wires of another PLA cluster.

20. The array of PLA clusters of claim 19, wherein the array of PLA cluster further comprises a third set of programmable ON-OFF devices associated with crossings between the first plurality of nanoscale wires of the another PLA cluster and the fifth plurality of nanoscale wires of the one of the PLA cluster.

21. The array of PLA clusters of claim 20, wherein the programmable ON-OFF devices are diodes.

22. The array of PLA clusters of claim 1, further comprising a plurality of ohmic contacts connected with inputs and/or outputs of the array.

23. The array of PLA clusters of claim 22, wherein the ohmic contacts are nanoscale ohmic contacts.

24. The array of PLA clusters of claim 22, wherein the ohmic contacts are lithographic ohmic contacts.

25. The array of PLA clusters of claim 1, further comprising a plurality of ohmic contacts connected with inputs and/or outputs of at least one PLA cluster.

26. The array of PLA clusters of claim 24, wherein the ohmic contacts are nanoscale ohmic contacts.

27. The array of PLA clusters of claim 25, wherein the ohmic contacts are lithographic ohmic contacts.

28. The array of PLA clusters of claim 1, wherein PLA clusters within the array are connected to allow a signal to propagate from a first PLA cluster to a second PLA cluster in the array of PLA clusters.

29. The array of PLA clusters of claim 28, wherein the signal is allowed to propagate through one or more intermediate PLA clusters before reaching the second PLA cluster.

30. The array of PLA clusters of claim 1, wherein PLA clusters within the array are connected to allow a true-compliment signal pair to propagate from a first PLA cluster to a second PLA cluster in the array of PLA clusters.

31. The array of PLA clusters of claim 30, wherein the true-compliment signal pair is allowed to propagate through one or more intermediate PLA clusters before reaching the second PLA cluster.

32. The array of PLA clusters of claim 30, wherein the second PLA cluster checks the true-compliment signal pair in parallel with starting a computation on the signal.

33. The array of PLA clusters of claim 1, wherein each PLA cluster receives both polarities of each logical input signal.

34. The array of PLA clusters of claim 33, wherein both polarities of each logical input signal are provided by computing a true-compliment of each logic value and routing to the input of each PLA cluster.

35. The array of PLA clusters of claim 33, wherein both polarities of each logical input signal are provided by allowing logic paths in the interconnect to propagate though a plurality of inversions.

36. A method of interconnecting a plurality of programmable logic array (PLA) clusters, the method comprising:
providing a plurality of PLA clusters each comprising:
a first plurality of nanoscale wires forming a first wired logic;
a first restoring inverting arrangement connected with the first wired logic, the first restoring inverting arrangement comprising a second plurality of nanoscale wires crossing the first plurality of nanoscale wires, the first restoring inverting arrangement restoring and inverting signals of the first wired logic; and
a third plurality of nanoscale wires crossing the second plurality of nanoscale wires and forming a second wired logic;
forming an electrical contact between an output of at least one PLA cluster and an input of at least one other PLA cluster.

37. The method of claim 36, wherein the first wired logic is either a wired-OR logic or a wired-AND logic.

38. The method of claim 36, wherein the second wired logic is a wired-OR logic.

39. The method of claim 36, wherein each PLA cluster further comprises a first restoring non-inverting arrangement connected with the first wired logic, the first restoring non-inverting arrangement comprising another plurality of nanoscale wires crossing the first plurality of nanoscale wires, the first restoring non-inverting arrangement restoring signals of the first wired logic.

40. The method of claim 36, wherein the electrical contact is programmable.

41. The method of claim 36, wherein each PLA cluster further comprises a first set of programmable ON-OFF devices associated with crossings between the second plurality of nanoscale wires and the third plurality of nanoscale wires.

42. The method of claim 41, wherein the programmable ON-OFF devices are diodes.

43. The method of claim 36, wherein each PLA cluster further comprises a fourth plurality of nanoscale wires acting as feedback signals in the PLA cluster.

44. The method of claim 43, wherein the fourth plurality of nanoscale wires crosses the first plurality of nanoscale wires and the third plurality of nanoscale wires.

45. The method of claim 44, wherein the fourth plurality of nanoscale wires comprises a second restoring inverting arrangement for restoring and inverting signals on the third plurality of nanoscale wires.

46. The method of claim 44, wherein the fourth plurality of nanoscale wires comprises a first restoring non-inverting arrangement for restoring signals on the third plurality of nanoscale wires.

47. The method of claim 44, wherein each PLA cluster further comprises a second set of programmable ON-OFF devices associated with crossings between the first plurality of nanoscale wires and the fourth plurality of nanoscale wires.

48. The method of claim 47, wherein the programmable ON-OFF devices are diodes.

49. The method of claim 36, wherein at least one PLA cluster comprises a fifth plurality of nanoscale wires for connecting the first wired logic of one of the PLA cluster with the third plurality of nanoscale wires of the at least one PLA cluster.

50. The method of claim 36, wherein at least one PLA cluster comprises a fifth plurality of nanoscale wires for connecting the first wired logic of the at least one PLA cluster with the third plurality of nanoscale wires of another PLA cluster.

51. The method of claim 49, wherein the fifth plurality of nanoscale wires contains a third restoring inverting arrangement for restoring and inverting signals on the third plurality of nanoscale wires of the at least one PLA cluster.

52. The method of claim 50, wherein the fifth plurality of nanoscale wires contains a third restoring inverting arrangement for restoring and inverting signals on the third plurality of nanoscale wires of the another PLA cluster.

53. The method of claim 49, wherein the fifth plurality of nanoscale wires contains a second restoring non-inverting arrangement for restoring signals on the third plurality of nanoscale wires of the at least one PLA cluster.

54. The method of claim 50, wherein the fifth plurality of nanoscale wires contains a second restoring non-inverting arrangement for restoring signals on the third plurality of nanoscale wires of the another PLA cluster.

55. The method of claim 36, wherein the array of PLA clusters further comprises a fifth plurality of nanoscale wires, wherein the fifth plurality of nanoscale wires of one of the PLA cluster crosses the first plurality of nanoscale wires of another PLA cluster.

56. The method of claim 55, wherein the array of PLA cluster further comprises a third set of programmable ON-OFF devices associated with crossings between the first plurality of nanoscale wires of the another PLA cluster and the fifth plurality of nanoscale wires of the one of the PLA cluster.

57. The method of claim 56, wherein the programmable ON-OFF devices are diodes.

58. The method of claim 36, further comprising connecting a plurality of ohmic contacts with inputs and/or outputs of the array.

59. The method of claim 58, wherein the ohmic contacts are nanoscale ohmic contacts.

60. The method of claim 58, wherein the ohmic contacts are lithographic ohmic contacts.

61. The method of claim 36, further comprising connecting a plurality of ohmic contacts with inputs and/or outputs of at least one PLA cluster.

62. The method of claim 60, wherein the ohmic contacts are nanoscale ohmic contacts.

63. The method of claim 61, wherein the ohmic contacts are lithographic ohmic contacts.

64. The method of claim 36, further comprising connecting PLA clusters within the array to allow a signal to propagate from a first PLA cluster to a second PLA cluster in the array of PLA clusters.

65. The method of claim 64, wherein the signal is allowed to propagate through one or more intermediate PLA clusters before reaching the second PLA cluster.

66. The method of claim 65, wherein the signal propagates through the one or more intermediate PLA clusters that are disposed horizontally within the array of PLA clusters before reaching the second PLA cluster.

67. The method of claim 65, wherein the signal propagates through the one or more intermediate PLA clusters that are disposed vertically within the array of PLA clusters before reaching the second PLA cluster.

68. The method of claim 65, wherein intermediate routing is provided through a first set of outputs and a second set of outputs disposed on opposite horizontal sides of a PLA cluster, wherein the first set of outputs routes in a first vertical direction and the second set of outputs routes in a vertical direction that is opposite to the first vertical direction.

69. The method of claim 36, further comprising connecting PLA clusters within the array to allow a true-compliment signal pair to propagate from a first PLA cluster to a second PLA cluster in the array of PLA clusters.

70. The method of claim 69, wherein the true-compliment signal pair is allowed to propagate through one or more intermediate PLA clusters before reaching the second PLA cluster.

71. An array of programmable logic array (PLA) nanoscale clusters wherein an output of at least one PLA cluster forms an input of at least one other PLA cluster.

72. An array of interconnected programmable logic array (PLA) nanoscale clusters comprising nanoscale wires adapted to perform logical functions of the individual PLA nanoscale clusters and adapted to propagate signals throughout the array.

73. A method of implementing arbitrary logic at nanoscale, the method comprising:
  providing a plurality of PLA clusters each comprising:
    a first plurality of nanoscale wires forming a first wired logic;
    a first restoring inverting arrangement connected with the first wired logic, the first restoring inverting arrangement comprising a second plurality of nanoscale wires crossing the first plurality of nanoscale wires, the first restoring inverting arrangement restoring and inverting signals of the first wired logic; and
    a third plurality of nanoscale wires crossing the second plurality of nanoscale wires and forming a second wired logic;
  decomposing a logic function into logical clusters compatible with a PLA clusters;
  assigning each logical cluster to a PLA cluster within the plurality of PLA clusters; and
  configuring the array of PLA clusters to avoid defective nanowires and crosspoints while implementing each logical cluster on each assigned PLA cluster and routing signals through the plurality of PLA clusters from each PLA cluster producing a signal to each PLA cluster using a signal, including forming an electrical contact between an output of at least one PLA cluster and an input of at least one other PLA cluster.

* * * * *